United States Patent
Shishido et al.

(10) Patent No.: US 10,088,744 B2
(45) Date of Patent: Oct. 2, 2018

(54) MASK BLANK, METHOD OF MANUFACTURING PHASE SHIFT MASK, PHASE SHIFT MASK, AND METHOD OF MANUFACTURING SEMICONDUCTOR DEVICE

(71) Applicant: HOYA CORPORATION, Tokyo (JP)

(72) Inventors: Hiroaki Shishido, Tokyo (JP); Osamu Nozawa, Tokyo (JP); Takashi Uchida, Tokyo (JP)

(73) Assignee: HOYA CORPORATION, Shinjuku-ku, Tokyo (JP)

( * ) Notice: Subject to any disclaimer, the term of this patent is extended or adjusted under 35 U.S.C. 154(b) by 0 days.

(21) Appl. No.: 15/122,486

(22) PCT Filed: Feb. 24, 2015

(86) PCT No.: PCT/JP2015/055128
§ 371 (c)(1),
(2) Date: Aug. 30, 2016

(87) PCT Pub. No.: WO2015/146422
PCT Pub. Date: Oct. 1, 2015

(65) Prior Publication Data
US 2017/0068155 A1 Mar. 9, 2017

(30) Foreign Application Priority Data
Mar. 28, 2014 (JP) ................. 2014-069812

(51) Int. Cl.
*G03F 1/30* (2012.01)
*G03F 1/58* (2012.01)
*G03F 1/80* (2012.01)
*C23C 14/06* (2006.01)
*C23C 14/34* (2006.01)
*C23C 14/58* (2006.01)
*G03F 7/20* (2006.01)
*G03F 7/34* (2006.01)
*H01L 21/033* (2006.01)

(52) U.S. Cl.
CPC ............ *G03F 1/30* (2013.01); *C23C 14/0664* (2013.01); *C23C 14/0676* (2013.01); *C23C 14/34* (2013.01); *C23C 14/5873* (2013.01); *G03F 1/58* (2013.01); *G03F 1/80* (2013.01); *G03F 7/2006* (2013.01); *G03F 7/34* (2013.01); *H01L 21/0332* (2013.01)

(58) Field of Classification Search
CPC ..... G03F 1/30; G03F 1/58; G03F 1/80; G03F 7/2006; G03F 7/34; H01L 21/0332; C23C 14/0664; C23C 14/0676; C23C 14/34; C23C 14/5873
USPC ............................................. 430/5
See application file for complete search history.

(56) References Cited

U.S. PATENT DOCUMENTS

| 2007/0020534 A1 | 1/2007 | Yoshikawa et al. |
| 2011/0111332 A1 | 5/2011 | Iwashita et al. |
| 2012/0156596 A1 | 6/2012 | Kominato et al. |
| 2013/0309598 A1 | 11/2013 | Fukaya et al. |
| 2013/0309601 A1 | 11/2013 | Fukaya et al. |

FOREIGN PATENT DOCUMENTS

| JP | 2007-33470 A | 2/2007 |
| JP | 2012-141583 A | 7/2012 |
| JP | 2013-238776 A | 11/2013 |
| JP | 2013-238777 A | 11/2013 |
| WO | 2009/157506 A1 | 12/2009 |

OTHER PUBLICATIONS

International Search Report for PCT/JP2015/055128 dated Apr. 7, 2015.

*Primary Examiner* — Christopher G Young
(74) *Attorney, Agent, or Firm* — Sughrue Mion, PLLC

(57) ABSTRACT

A mask blank having a structure in which, on a transparent substrate, a light shielding film and a hard mask film are laminated in the stated order from the transparent substrate side. The hard mask film is formed of a material containing at least one element selected from silicon and tantalum, and the light shielding film is formed of a material containing chromium. The mask blank has a structure of three layers wherein a lower layer, an intermediate layer, and an upper layer are laminated in the stated order from the transparent substrate side. The upper layer has a lowest content of chromium in the light shielding film, the intermediate layer has a highest content of chromium in the light shielding film. It contains at least one metallic element selected from indium, tin, and molybdenum.

20 Claims, 5 Drawing Sheets

MASK BLANK, METHOD OF MANUFACTURING PHASE SHIFT MASK, PHASE SHIFT MASK, AND METHOD OF MANUFACTURING SEMICONDUCTOR DEVICE

CROSS REFERENCE TO RELATED APPLICATIONS

This application is a National Stage of International Application No. PCT/JP2015/055128 filed Feb. 24, 2015, claiming priority based on Japanese Patent Application No. 2014-069812 filed Mar. 28, 2014, the contents of all of which are incorporated herein by reference in their entirety.

TECHNICAL FIELD

This invention relates to a mask blank for a digging Levenson type phase shift mask, a phase shift mask using the mask blank, and a method of manufacturing a phase shift mask, and further a method of manufacturing a semiconductor device.

BACKGROUND ART

As a mask blank for a digging Levenson type phase shift mask, there is known a mask blank having a laminated structure wherein, from a side of a transparent substrate of a glass material, a light shielding film made of a chromium-based compound is laminated. In a phase shift mask formed using such mask blank, a transfer pattern is formed of a light shielding pattern, which is formed by patterning the light shielding film by dry etching using a mixture gas of a chlorine-based gas and oxygen, and a phase shift pattern, which is obtained by digging the transparent substrate by dry etching using a fluorine-based gas.

Moreover, when the light shielding film forms a part of the transfer pattern as in the digging Levenson type phase shift mask described above, both a front surface side and a back surface side of the light shielding film should have low reflectances with respect to exposure light used for exposure and transfer using the phase shift mask. Therefore, to reduce the reflectances of the light shielding film and to secure a light shielding property, a proposal has been made about the configuration in which a film of a low chromium composition, a chrome metal film, and a film of a low chromium composition are successively laminated in the stated order (see JP-A-2007-33470 (Patent Document 1)).

Meanwhile, for the purpose of increasing an etching rate in dry etching while maintaining optical characteristics of the light shielding film made of the chromium-based compound, there has been proposed the structure in which the light shielding film is made of a chromium-based material containing tin. In this case, there have been exemplified a configuration wherein a film having a content of tin that is 0.01 times a content of chromium or more is formed only about a layer which should mainly have an antireflection function or to the contrary, a configuration in which a film having a content of tin that is 0.01 times a content of chromium or more is formed only about a layer which should have mainly a light shielding function and any other configurations (see JP-A-2013-238777 (Patent Document 2)).

PRIOR ART DOCUMENTS

Patent Document

Patent Document 1: JP-A-2007-33470
Patent Document 2: JP-A-2013-238777

SUMMARY OF THE INVENTION

Problem to be Solved by the Invention

In dry etching of a light shielding film made of a chromium-based material, a mixture gas of a chlorine-based gas and an oxygen gas (chlorine-based gas containing oxygen) is used as an etching gas. In general, the dry etching using the chlorine-based gas containing oxygen as the etching gas tends to have low anisotropy etching, and tends to have high isotropy etching.

In general, when a pattern is formed in a thin film by dry etching, it is difficult to control the etching so as to progress only in a thickness direction of the film, and it is inevitable for the etching to progress also in a side wall direction of the pattern formed in the thin film (side etching). In order to suppress the progress of the side etching, it has been a general practice to apply a bias voltage from a side opposite to a main surface, on which the thin film is formed, of a substrate during the dry etching to perform control so that more etching gas is brought into contact with the thickness direction of the film. In the case of dry etching (dry etching mainly with ions) using an etching gas, such as a fluorine-based gas, which is liable to tend to become ionic plasma, controllability of an etching direction by applying the bias voltage is high, that is, anisotropy of etching is increased, with the result that an amount of side etching in the thin film to be etched may be minimized.

Meanwhile, in the case of the dry etching using the chlorine-based gas containing oxygen, the oxygen gas has a high tendency to become radical plasma, and hence the effect of controlling the etching direction by applying the bias voltage is small, that is, it is difficult to increase the anisotropy of the etching. Therefore, when a pattern is to be formed in a light shielding film made of a chromium-based material by the dry etching using the chlorine-based gas containing oxygen, there has been a tendency for the amount of side etching to be increased.

When the light shielding film made of the chromium-based material is patterned by the dry etching using the chlorine-based gas containing oxygen and using a resist pattern made of an organic-based material as an etching mask, the resist pattern is etched and eroded from an upper portion, but is also etched and eroded in the side wall direction of the pattern. Therefore, a width of the pattern to be formed in the resist film is formed taking into consideration an amount of erosion by the side etching in advance. In addition, the width of the pattern to be formed in the resist film is formed also taking into consideration the amount of side etching in the light shielding film made of the chromium-based material.

In recent years, use has been made about a mask blank in which a hard mask, which is made of a material having sufficient etching selectivity with respect to the chromium-based material for the dry etching using the chlorine-based gas containing oxygen, is provided on the light shielding film made of the chromium-based material. In the mask blank, a pattern is formed in the hard mask film by performing dry etching by using the resist pattern as a mask. Then, dry etching using the chlorine-based gas containing oxygen and using the hard mask film having the pattern as a mask is performed on the light shielding film to form the pattern in the light shielding film. This hard mask film is generally formed of a material that is capable of being patterned by dry etching using a fluorine-based gas. The dry etching using the fluorine-based gas is etching mainly with ions, and hence has a high tendency of the anisotropy etching. An amount of side etching in the side walls of the pattern in the hard mask film, in which the phase shift pattern has been formed, is small. Moreover, in the case of the dry etching using the fluorine-based gas, an amount of side etching in the resist pattern also tends to be small. Therefore, there has been an increasing demand that the light shielding film made of the chromium-based material be also small in amount of side etching in the dry etching using the chlorine-based gas containing oxygen.

As means for solving the problem of the side etching in the light shielding film made of the chromium-based material, in the dry etching using the chlorine-based gas containing oxygen, it has been considered to significantly increase a mixture ratio of the chlorine-based gas in the chlorine-based gas containing oxygen. This is because the chlorine-based gas has the high tendency to become ionic plasma. In dry etching using the chlorine-based gas containing oxygen with an increased ratio of the chlorine-based gas, an etching rate of the light shielding film made of the chromium-based material is inevitably reduced. In order to supplement the reduction in etching rate of the light shielding film made of the chromium-based material, it has also been considered to significantly increase the bias voltage applied during the dry etching (the dry etching performed by using the chlorine-based gas containing oxygen with the increased ratio of the chlorine-based gas and under a state in which a high bias voltage is applied is hereinafter referred to as high-bias etching using the chlorine-based gas containing oxygen).

The etching rate of the light shielding film made of the chromium-based material by the high-bias etching using the chlorine-based gas containing oxygen attains a level comparable to that in a case where dry etching is performed under the etching conditions in the related art. Moreover, the amount of side etching in the light shielding film, which occurs during the etching, may also be reduced from that in the related art. However, it has been found as a result of an intense research by the inventors of the subject application that, when the light shielding film made of the chromium-based material is formed of a multi-layer structure made of materials of respectively different compositions, a difference in amount of side etching among the layers becomes significant. More specifically, it has been found that, as a content of chromium in the thin film made of the chromium-based material becomes lower, the amount of side etching becomes larger, and as a content of oxygen in the thin film made of the chromium-based material becomes higher, the amount of side etching becomes larger.

In a case of a light shielding film used for the digging Levenson type phase shift film, the light shielding film is not only required to satisfy a predetermined light shielding property (for example, optical density OD of 2.8 or more) with respect to the exposure light by itself, but also to be low both in front surface reflection of the light shielding film with respect to the exposure light and in back surface reflection of the light shielding film with respect to exposure light that enters from the transparent substrate side. Further, the light shielding film is also required to have a small thickness at the same time. In order for the light shielding film to satisfy those conditions at the same time, it is preferred that the light shielding film have the three-layer structure in which a lower layer, an intermediate layer, and an upper layer are laminated in the stated order from the transparent substrate side.

More specifically, a material having the highest content of chromium is applied to the intermediate layer of the light shielding film, and materials having low contents of chromium are applied to the upper layer and the lower layer. In general, the condition on the reflectance of the exposure light is stricter for the front surface side than for the back surface side. When this is taken into consideration, the upper layer of the light shielding film is formed of a material having a content of chromium that is lowest of the three layers, and containing a largest amount of oxygen of the three layers. Meanwhile, based on the facts that the condition on the reflectance on the back surface side is relatively mild, and that the light shielding property needs to be secured also in the layers other than the intermediate layer to reduce a total thickness of the light shielding film, it has been desired that the lower layer of the light shielding film be formed of a material having a content of chromium that is higher than that of the upper layer, and having a content of oxygen that is lower than that of the upper layer.

However, there has been found a big problem in such mask blank in which, on the transparent substrate, the light shielding film made of the chromium-based material, which has the three-layer laminate structure, and the hard mask film are laminated. When this mask blank has been used to pattern the light shielding film by dry etching using high-bias etching, and using as a mask the hard mask film, in which the pattern is formed, a large step has been disadvantageously generated in a cross-sectional shape of side walls of the pattern formed in the light shielding film. More specifically, the intermediate layer, which is a layer having the highest content of chromium, has been fine with a small amount of erosion (amount of side etching) of the pattern as viewed from the side walls of the pattern in the hard mask film. Meanwhile, the upper layer, which is a layer having the lowest content of chromium and the highest content of oxygen, has been in a state in which the amount of erosion (amount of side etching) in the side walls of the pattern has been very large. In addition, the lower layer has also been in a state in which the amount of erosion (amount of side etching) in the side walls of the pattern has been large as compared to the intermediate layer, if not as severe as the upper layer.

In view of the above, it is an object of this invention to provide a mask blank for an digging Levenson type phase shift mask having the structure including a light shielding film formed of a material containing chromium on a transparent substrate, which is capable of, even when the light shielding film is patterned by dry etching using a chlorine-based gas containing oxygen as an etching gas under a high-bias etching condition, maintaining a good form accuracy of side walls of a pattern while maintaining optical characteristics of the light shielding film in which the pattern is formed. It is another object of this invention to provide a method of manufacturing a phase shift mask, which uses the mask blank, thereby being capable of forming a digging pattern with good accuracy, and further to provide the phase shift mask obtained thereby, and a method of manufacturing a semiconductor device.

Means to Solve the Problem

This invention has the following configurations as means to solve the above-mentioned problems.

(Structure 1)
A mask blank having a structure in which, on a transparent substrate, a light shielding film and a hard mask film are laminated in the stated order from the transparent substrate side, the hard mask film being formed of a material containing at least one element selected from silicon and tantalum, the light shielding film being formed of a material containing chromium, and having a structure of three layers wherein a lower layer, an intermediate layer, and an upper layer are laminated in the stated order from the transparent substrate side, the upper layer having a lowest content of chromium in the light shielding film, the intermediate layer having a highest content of chromium in the light shielding film, and containing at least one metallic element selected from indium, tin, and molybdenum.

(Structure 2)
The mask blank according to structure 1, wherein each of the upper layer and the lower layer has a total content of the metallic element that is lower than a total content of the metallic element of the intermediate layer, or does not contain the metallic element.

(Structure 3)
The mask blank according to structure 1 or 2, wherein the upper layer has a highest content of oxygen in the light shielding film.

(Structure 4)
The mask blank according to any one of structures 1 to 3,
wherein the lower layer has a total content of the metallic element that is lower than a total content of the metallic element of the intermediate layer, and
wherein the upper layer has a lowest total content of the metallic element in the light shielding film, or does not contain the metallic element.

(Structure 5)
The mask blank according to any one of structures 1 to 4, wherein the intermediate layer has a lowest total content of oxygen in the light shielding film, or does not contain oxygen.

(Structure 6)
The mask blank according to any one of structures 1 to 5, wherein the hard mask film is formed of a material containing silicon and oxygen.

(Structure 7)
The mask blank according to any one of structures 1 to 6, wherein the light shielding film is capable of being patterned by dry etching using a mixture gas of a chlorine-based gas and an oxygen gas.

(Structure 8)
The mask blank according to any one of structures 1 to 7, wherein the hard mask film is capable of being patterned by dry etching using a fluorine-based gas.

(Structure 9)
The method of manufacturing a phase shift mask using the mask blank of any one of structures 1 to 8, the method comprising the steps of:
forming a light shielding pattern in the hard mask film by dry etching using a fluorine-based gas and using as a mask a resist film having a light shielding pattern, which is formed on the hard mask film;
forming the light shielding pattern in the light shielding film by dry etching using a mixture gas of a chlorine-based gas and an oxygen gas, and using as a mask the hard mask film, in which the light shielding pattern has been formed; and
forming a digging pattern in the transparent substrate by dry etching using a fluorine-based gas and using as a mask a resist film having the digging pattern, which is formed on the light shielding film.

(Structure 10)
A phase shift mask having a structure in which a light shielding film, in which a light shielding pattern is formed, is laminated on one main surface of a transparent substrate having a digging pattern formed on a one main surface side, the light shielding film being formed of a material containing chromium, and having a structure of three layers wherein a lower layer, an intermediate layer, and an upper layer are laminated in the stated order from the transparent substrate side, the upper layer having a lowest content of chromium in the light shielding film, the intermediate layer having a highest content of chromium in the light shielding film, and containing at least one metallic element selected from indium, tin, and molybdenum.

(Structure 11)
The phase shift mask according to structure 10, wherein each of the upper layer and the lower layer has a total content of the metallic element that is lower than a total content of the metallic element of the intermediate layer, or does not contain the metallic element.

(Structure 12)
The phase shift mask according to structure 10 or 11, wherein the upper layer has a highest content of oxygen in the light shielding film.

(Structure 13)
The phase shift mask according to any one of structures 10 to 12, wherein the lower layer has a total content of the metallic element that is lower than a total content of the metallic element of the intermediate layer, and
wherein the upper layer has a lowest total content of the metallic element in the light shielding film, or does not contain the metallic element.

(Structure 14)
The phase shift mask according to any one of structures 10 to 13, wherein the intermediate layer has a lowest total content of oxygen in the light shielding film, or does not contain oxygen.

(Structure 15)
The phase shift mask according to any one of structures 10 to 14, wherein the light shielding film is capable of being patterned by dry etching using a mixture gas of a chlorine-based gas and an oxygen gas.

(Structure 16)
A method of manufacturing a semiconductor device, comprising an exposure step of patterning and transferring a transfer pattern of a phase shift mask, which is produced by the method of manufacturing a phase shift mask of structure 9, on a resist film on a substrate by a lithography method using the phase shift mask.

(Structure 17)
A method of manufacturing a semiconductor device, comprising an exposure step of patterning and transferring a transfer pattern of the phase shift mask of any one of structures 10 to 15 on a resist film on a substrate by a lithography method using the phase shift mask.

Effect of the Invention

According to this invention having the above-mentioned configurations, there can be obtained the mask blank for the digging Levenson type phase shift mask having the structure including the light shielding film formed of the material containing chromium on the transparent substrate, which is capable of, even when the light shielding film is patterned by the dry etching using the chlorine-based gas containing oxygen as the etching gas under the high-bias etching condition, maintaining the good form accuracy of the side walls while maintaining the optical characteristics of the light shielding film in which the pattern is formed. Moreover, the digging Levenson type phase shift mask having the good digging pattern form accuracy can be manufactured using the mask blank, and further, the pattern can be formed with good accuracy in the manufacturing of the semiconductor device using the phase shift mask.

MODES FOR EMBODYING THE INVENTION

Figure 1:
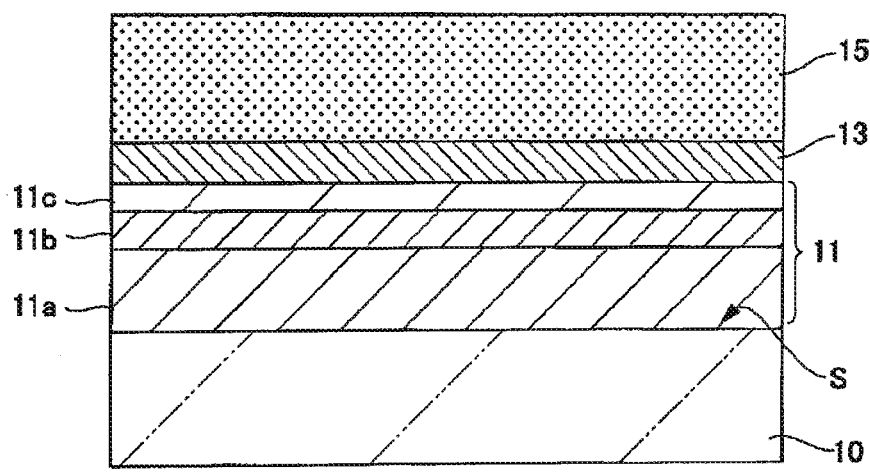
FIG. 1 is a cross-sectional view for illustrating the structure of a mask blank according to a first embodiment of this invention.

The inventors of this invention have conducted an intense research on, in a mask blank for manufacturing a digging Levenson type phase shift mask, the mask blank having the structure in which, on a transparent substrate, a light shielding film and a hard mask film are laminated in the stated order from the transparent substrate side, the light shielding film having the structure in which a lower layer, an intermediate layer, and an upper layer are laminated from the transparent substrate side, the structure of the light shielding film having a good cross-sectional shape of side walls of a pattern in the light shielding film, which is formed when the light shielding film is patterned by high-bias etching using a chlorine-based gas containing oxygen. More specifically, the inventors of this invention have investigated the structure of the light shielding film, which has a small difference in amount of side etching among the layers of the light shielding film, and satisfies conditions of a predetermined optical density and reflectances on a front surface side and a back surface side by the light shielding film itself.

In the related-art structure of the light shielding film, a cross-sectional shape after the etching has an increasing amount of side etching (erosion of the pattern increases) in order of the intermediate layer, the lower layer, and the upper layer. First, it has been considered to change a composition of the upper layer so as to reduce the amount of side etching in the upper layer. In order to reduce the amount of side etching in the upper layer, it is effective to increase a content of chromium and reduce a content of oxygen in the upper layer. However, the upper layer should have a function of reducing front surface reflection of the light shielding film. Increasing the content of chromium and reducing the content of oxygen in the upper layer both reduce a transmittance of the upper layer with respect to exposure light, and hence lead to an increase in surface reflectance. Therefore, there are great constraints on increasing the content of chromium and reducing the content of oxygen in the upper layer, and it is difficult to reduce the amount of side etching by adjusting the composition of the upper layer.

Meanwhile, also when it is considered to reduce the amount of side etching in the lower layer of the light shielding film, it is effective to increase the content of chromium and reducing the content of oxygen in the lower layer. However, even though there are not such rigid constraints as those on the front surface reflection of the upper layer, the lower layer also should have a function of reducing back surface reflection (reflectance on the substrate side) of the light shielding film.

A light shielding pattern to be formed in the light shielding film has a coarse/dense difference in pattern in the plane. When dry etching is performed on the light shielding film, a difference arises in time when the etching reaches a lower surface of the light shielding film between a relatively coarse pattern and a relatively dense pattern. When the time difference is large, the light shielding film tends to be divided in the plane into two regions: a region in which the patterning by the etching is finished first, and a region in which the light shielding film still remains and the patterning has not been finished. Moreover, also in view of the progress of the etching of individual patterns, a center side of a part to be removed in the pattern tends to reach the lower surface first.

Under the above-mentioned circumstances, it is a general practice to perform additional dry etching (over etching) to pattern a region in which pattern formation is not complete or to increase verticality of the side walls of the pattern. Further, in order to reduce time for the over etching, there is a need to increase the etching rate of the lower layer of the light shielding film. Under such circumstances, there are constraints on increasing the content of chromium and reducing the content of oxygen in the lower layer, and it is also difficult to reduce the amount of side etching by adjusting the composition of the lower layer.

When the etching rate in the high-bias etching using the chlorine-based gas containing oxygen of the intermediate layer of the light shielding film is slightly increased, the amount of side etching in the intermediate layer after the patterning of the light shielding film is slightly increased. Moreover, when the etching rate of the intermediate layer is slightly increased, the time (etching time) required to pattern the light shielding film is reduced, and hence the time during which the upper layer is exposed to the etching gas is reduced. As a result, the side etching in the upper layer is suppressed. In order to increase the etching rate of the intermediate layer, it may be contemplated to reduce the content of chromium and increase the content of oxygen in the intermediate layer. However, when those measures are taken, an extinction coefficient k of the material forming the intermediate layer is inevitably reduced, that is, the light shielding property is inevitably reduced. Then, there arises a need to make a thickness of the intermediate layer larger than in the related art to secure a predetermined optical density. As a consequence, it becomes difficult to reduce the etching time of the light shielding film.

In view of the above, it has been considered to allow the light shielding film to contain at least one metallic element selected from indium, tin, and molybdenum (those metallic elements are hereinafter referred to as "indium and other such metallic elements") to increase the etching rate of the dry etching using the chlorine-based gas containing oxygen. More specifically, of the three layers forming the light shielding film, the intermediate layer, which is a layer having the lowest etching rate and the smallest amount of side etching, is allowed to contain the largest amount of the above-mentioned indium and other such metallic elements. As a result, a reduction in light shielding property of the intermediate layer may be suppressed while improving the etching rate of the dry etching of the intermediate layer using the chlorine-based gas containing oxygen.

Moreover, the front surface reflection of the light shielding film should be low, and hence the upper layer of the light shielding film should have a lowest content of chromium within the three layers. This is basically the same as the related-art light shielding film having the three-layer structure, which is made of the chromium-based material. However, the intermediate layer is allowed to contain the largest amount of the above-mentioned indium and other such metallic elements, and hence a relationship among the three layers of the etching rates for the dry etching using the chlorine-based gas containing oxygen is changed significantly from that of the related-art light shielding film. More specifically, a degree by which the etching rate of the intermediate layer is increased becomes larger than degrees by which etching rates of the other two layers are increased as compared to the related-art light shielding film. As a result, there is a reduced state in which the part of the intermediate layer is relatively projected in a cross-sectional shape of the side walls of the pattern obtained when the light shielding film is patterned. Moreover, the etching rate of the entire light shielding film is improved, with the result that the time during which the side walls of the upper layer are exposed to the etching gas is reduced, and hence the amount of side etching in the upper layer is reduced. In addition, the over-etching time is also reduced, with the result that the time during which the side walls of the lower layer are exposed to the etching gas is also reduced, and hence the amount of side etching in the lower layer is also reduced. The inventors of the subject application have found that, as a result of the above-mentioned synergistic effect, the cross-sectional shape of the side walls of the pattern obtained when the light shielding film is patterned by the dry etching using the chlorine-based gas containing oxygen becomes satisfactory.

As a result of the above-mentioned research, a mask blank according to this invention has a configuration in which a light shielding film formed of a material containing chromium has the following three-layer structure: a lower layer, an intermediate layer, and an upper layer, in which the upper layer has a content of chromium that is lowest in the light shielding film, and in which the intermediate layer has the highest content of chromium in the light shielding film, and contains at least one of indium and other such metallic elements selected from indium, tin, and molybdenum.

The detailed configuration of the present invention described above is now described with reference to the drawings. The same reference symbols are given to like components in each of the drawings.

<<Mask Blank According to First Embodiment>>

FIG. 1 is a cross-sectional view of a main part of a mask blank 1 according to a first embodiment of this invention. As illustrated in the figure, the mask blank 1 has the structure in which, on a main surface S, which is one side of a transparent substrate 10, a light shielding film 11 and a hard mask film 13 are laminated in the stated order from a main surface S side. Of the structure, the light shielding film 11 has the structure in which the following three layers: a lower layer 11a, an intermediate layer 11b, and an upper layer 11c are laminated in the stated order from the transparent substrate 10 side. Moreover, the mask blank 1 may have the configuration in which a resist film 15 is laminated on the hard mask film 13 as necessary. Details of main constituent parts of the mask blank 1 are hereinafter described.

<Transparent Substrate 10>

The transparent substrate 10 is made of a material having a good transparency with respect to exposure light used in an exposure step of lithography. When an ArF excimer laser light (wavelength: about 193 nm) is used as the light, the transparent substrate 10 may be made of a material having permeability with respect to the ArF excimer laser light. As such material, synthetic quartz glass is used, but instead, other various glass substrates may be used, such as aluminosilicate glass, soda-lime glass, and low thermal expansion glass (such as SiO2-TiO2 glass). In particular, a quartz substrate using synthetic quartz glass has high transparency in a region of the ArF excimer laser light or lower wavelength, and hence may be used particularly preferably as the transparent substrate 10 of the mask blank according to this invention.

The "exposure step of the lithography" as used herein refers to an exposure step of lithography using the phase shift mask produced by the use of the mask blank 1, and the "exposure light" hereinafter means exposure light used in the exposure step. As the exposure light, any one of an ArF excimer laser light (wavelength: 193 nm), a KrF excimer laser light (wavelength: 248 nm), or an i-line light (wavelength: 365 nm) may be applied, but in view of miniaturizing the phase shift pattern in the exposure step, it is desired to apply the ArF excimer laser light to the exposure light. Therefore, embodiments in a case where the ArF excimer laser light is applied to the exposure light are described below.

<Light Shielding Film 11>

The light shielding film 11 is a film forming a light shielding pattern to be formed in the mask blank 1, and is a film having a light shielding property with respect to the exposure light used in the exposure step of the lithography. Such light shielding film 11 has an optical density (OD) with respect to the ArF excimer laser light of 2.8 or more, for example, and preferably 3.0 or more. Moreover, in order to prevent a problem in exposure and transfer due to reflection of the exposure light in the exposure step of the lithography, surface reflectances of the exposure light are suppressed to low levels on main surfaces on both sides. In particular, it is desired that the reflectance on the front surface side (surface on the side farthest from the transparent substrate) of the light shielding film, on which reflected light of the exposure light from a reduction optical system of an exposure apparatus impinges, be 25% or less, for example. This is for suppressing stray light generated by multiple reflection between the front surface of the light shielding film and a lens of the reduction optical system.

Meanwhile, it is desired that the reflectance on the back surface side (surface on the transparent substrate side) of the light shielding film, on which the exposure light from a projection optical system of the exposure apparatus impinges, be less than 40% (preferably 35% or less), for example. This is for suppressing stray light generated by multiple reflection between an interface between the transparent substrate and the back surface of the light shielding film, and the main surface on the projection optical system side of the transparent substrate. Moreover, a thickness of the light shielding film 11 is preferably 70 nm or less, more preferably 65 nm or less, and particularly preferably 60 nm or less.

Moreover, to the light shielding film 11, a material having sufficient etching selectivity with respect to an etching gas (fluorine-based gas) used in forming a digging pattern in the transparent substrate 10 should be applied.

Such light shielding film 11 in this example is formed of a material containing chromium (Cr), and has the structure of three layers comprising a lower layer 11a, an intermediate layer 11b, and an upper layer 11c, which have different contents of chromium (Cr), are laminated. More specifically, the contents of chromium (Cr) in the light shielding film 11 are set so that the contents of chromium are decreased in the order of the intermediate layer 11b, the lower layer 11a, and the upper layer 11c. Examples of the material containing chromium, which forms the light shielding film 11 include a material containing at least one element selected from oxygen, nitrogen, carbon, boron, hydrogen, and fluorine in addition to chrome metal.

The lower layer 11a is required to have the content of chromium of 35 at % or more, preferably 40 at % or more, and more preferably 45 at % or more. The lower layer 11a is also required to have the content of chromium of 55 at % or less, and preferably 50 at % or less.

For the purpose of suppressing a reduction in etching rate of the entire film while maintaining the optical density (OD), the light shielding film 11 further contains at least one metallic element (indium and other such metallic elements) selected from indium (In), tin (Sn), and molybdenum (Mo). Indium and other such metallic elements are mainly contained in the intermediate layer 11b. The light shielding film 11 preferably has a content of silicon (Si) of 10 at % or less, more preferably has a content of silicon (Si) of 5 at % or less, and particularly preferably contains no silicon (Si). This is because when the content of silicon in the light shielding film 11 becomes higher, the etching rate using the chlorine-based gas containing oxygen is significantly reduced.

Such light shielding film 11 is capable of being patterned by dry etching using the chlorine-based gas containing oxygen. Moreover, the light shielding film 11 has sufficient etching selectivity with respect to the hard mask film 13, which is formed of a material containing silicon (Si), and the light shielding film 11 is capable of being patterned using the hard mask film 13 as a mask.

In view of the above-mentioned circumstances, the lower layer 11a, the intermediate layer 11b, and the upper layer 11c, which form the light shielding film 11, have the following configurations, respectively.

The lower layer 11a is a layer provided closest to the transparent substrate 10 side, and functions as an antireflection layer on the transparent substrate 10 side (back surface side) of the light shielding film 11. While having a smaller effect of reducing reflection of the exposure light than the upper layer 11c, the lower layer 11a is adjusted in composition and optical characteristics (refractive index n and extinction coefficient k) so as to also function as a layer for complementing the light shielding property, which is insufficient with only the intermediate layer 11b for the light shielding film 11 to have a predetermined optical density. Such lower layer 11a has a content of chromium that is lower than that of the intermediate layer 11b, and is higher than that of the upper layer 11c. In this manner, the reflection of the exposure light at the interface between the lower layer 11a and the transparent substrate 10 is reduced. Moreover, when the light shielding film 11 is subjected to pattern etching by the dry etching using the chlorine-based gas containing oxygen to form a light shielding pattern, the etching rate of the lower layer 11a of the light shielding film 11 may be made higher than the etching rate of the intermediate layer 11b.

Moreover, the lower layer 11a has a content of chromium that is higher, and a content of oxygen that is lower, than those of the upper layer 11c to have an extinction coefficient that is higher than that of the upper layer 11c. As a result, the amount of side etching in the lower layer 11a during the patterning of the light shielding film 11 may be made smaller than that of the upper layer 11c.

Moreover, the lower layer 11a may contain at least one metallic element selected from indium (In), tin (Sn), and molybdenum (Mo) (indium and other such metallic elements) as well as the material containing chromium, or contain no indium and other such metallic element. When containing indium and other such metallic elements, the lower layer 11a has a total content of indium and other such metallic elements that is lower than that of the intermediate layer 11b. The lower layer 11a may contain indium and other such metallic elements to increase the etching rate of the dry etching using the chlorine-based gas containing oxygen. When the restriction on the back surface reflectance required of the light shielding film is relatively mild (for example, 40% or more, 45% or more, etc.), a reduction in etching rate of the dry etching using the chlorine-based gas containing oxygen may be suppressed even with a reduced content of oxygen and the like, which cause a reduction in extinction coefficient k.

Moreover, the lower layer 11a may contain no indium and other such metallic elements (indium and other such metallic elements are included by contamination or the like in an allowable content, and the lower layer 11a is allowed to have a content of indium and other such metallic elements in a range of 1 at % or less, for example) to suppress an increase in etching rate of the dry etching using the chlorine-based gas containing oxygen. When the restriction on the back surface reflectance required of the light shielding film is strict (for example, 30% or less, etc.), the increase in etching rate of the dry etching using the chlorine-based gas containing oxygen may be suppressed, and the increase in amount of side etching in the lower layer 11a may be suppressed even with increased contents of oxygen and nitrogen in the lower layer 11a for reducing the back surface reflectance.

The lower layer 11a is required to have a thickness of 60 nm or less, preferably 55 nm or less, and more preferably 50 nm or less. When the thickness of the lower layer 11a is too thick, the etching time of the light shielding film 11 as a whole with respect to the chlorine-based gas containing oxygen is increased. As a result, the time during which the upper layer 11c is exposed to the etching gas is increased, and hence the amount of side etching in the upper layer 11c is disadvantageously increased. The lower layer 11a is required to have the thickness of 20 nm or more, preferably 25 nm or more, and more preferably 30 nm or more. When the thickness of the lower layer 11a is too thin, the intermediate layer 11b should be thickened so that the light shielding film 11 has the predetermined optical density. As a result, the time during which the upper layer 11c is exposed to the etching gas is increased, and hence the amount of side etching in the upper layer 11c is disadvantageously increased.

The intermediate layer 11b is a layer that functions as a light shielding layer in the light shielding film 11. Such intermediate layer 11b is a layer having the highest content of chromium (Cr) in the light shielding film 11, and containing at least one metallic element selected from indium, tin, and molybdenum (indium and other such metallic elements). Such intermediate layer 11b has the highest content of chromium (Cr) in the light shielding film 11 to secure the light shielding property with respect to the exposure light. Moreover, the intermediate layer 11b may have the structure in which indium and other such metallic elements are added to increase the etching rate without reducing the optical density (OD). The total content of indium and other such metallic elements in such intermediate layer 11b is set in consideration of a total optical density (OD) of the light shielding film 11, but when the entire light shielding film 11 contains indium and other such metallic elements, the intermediate layer 11b has a content of indium and other such metallic elements that is higher than those of the lower layer 11a and the upper layer 11c.

Moreover, the intermediate layer 11b has the structure having the highest content of chromium (Cr) in the light shielding film 11 so as to have the content of oxygen that is lowest in the light shielding film, or so as not to contain oxygen.

The intermediate layer 11b is required to have a ratio M/(M+Cr) [%] of a total content M [at %] of indium and other such metallic elements to a total content (Cr+M) [at %] of chromium and indium and other such metallic elements of 5% or more, preferably 7% or more, and more preferably 10% or more. This is because the etching rate with respect to the dry etching using the chlorine-based gas containing oxygen is improved. Meanwhile, the intermediate layer 11b is required to have M/(M+Cr) [%] of 50% or less, preferably 30% or less, and more preferably 20% or less. This is because indium and other such metallic elements M are less resistant to chemical cleaning or cleaning with hot water than chromium.

The intermediate layer 11b is required to have a content of chromium of more than 55 at %, preferably 60 at % or more, and more preferably 65 at % or more. The intermediate layer 11b is also required to have the content of chromium of 85 at % or less, preferably 80 at % or less, and more preferably 75 at % or less.

The intermediate layer 11b is required to have a thickness of 30 nm or less, preferably 25 nm or less, and more preferably 20 nm or less. The intermediate layer 11b is required to have the thickness of 5 nm or more, preferably 10 nm or more, and more preferably 15 nm or more.

The upper layer 11c is a layer forming a top layer of the light shielding film 11, and functions as an antireflection layer on the front surface side (side opposite to the transparent substrate 10) of the light shielding film 11. Such upper layer 11c has the lowest content of chromium in the light shielding film 11. Moreover, the upper layer 11c has the highest content of oxygen in the light shielding film 11. With such structure, the upper layer 11c functions as a layer for preventing reflection of the exposure light at the top surface of the light shielding film 11. The upper layer 11c is required to have the content of chromium of 30 at % or more, preferably 35 at % or more, and more preferably 40 at % or more. This is for preventing the amount of side etching with respect to the dry etching using the chlorine-based gas containing oxygen from becoming much larger. Moreover, the upper layer 11c is required to have the content of chromium of 50 at % or less, and preferably 45 at % or less. This is for imparting a sufficient antireflection effect to the upper layer 11c.

The upper layer 11c may contain at least one metallic element selected from indium (In), tin (Sn), and molybdenum (Mo) (indium and other such metallic elements) as well as the material containing chromium. However, when containing, the upper layer 11c has the total content of indium and other such metallic elements that is lowest in the light shielding film 11, and may contain no indium and other such metallic elements. The upper layer 11c may contain no indium and other such metallic elements to form the upper layer 11c with the composition being satisfactorily controlled. Moreover, such upper layer 11a is required to have a thickness of 5 nm or more, and preferably 7 nm or more. Moreover, the upper layer 11c is required to be 20 nm or less, and preferably 15 nm or less.

<Hard Mask Film 13>

The hard mask film 13 is a film formed of a material having etching resistance to the etching gas used when the light shielding film 11 is etched. The hard mask film 13 may have a film thickness that is enough to function as an etching mask until the dry etching for forming the pattern in the light shielding film 11 is finished, and basically is not constrained by the optical characteristics. Therefore, the thickness of the hard mask film 13 may be significantly reduced as compared to the thickness of the light shielding film 11.

The hard mask film 13 is required to have a thickness of 20 nm or less, preferably 15 nm or less, and more preferably 10 nm or less. This is because, when the thickness of the hard mask film 13 is too thick, the resist film, which is used as a mask in the dry etching for forming the light shielding pattern in the hard mask film 13, should be thickened. The hard mask film 13 is required to have the thickness of 5 nm or more, and preferably 8 nm or more. This is because, when the thickness of the hard mask film 13 is too thin, there is a fear that the pattern of the hard mask film 13 may disappear before the dry etching for forming the light shielding pattern in the light shielding film 11 is finished, in dependency upon etching conditions of high-bias etching using a chlorine-based gas containing oxygen.

In addition, the resist film 15, which is made of an organic-based material and used as the etching mask in the dry etching for forming the pattern in the hard mask film 13, may have a film thickness that is enough to function as the etching mask until the dry etching of the hard mask film 13 is finished. Therefore, as a result of providing the hard mask film 13, the thickness of the resist film 15 may be made thinner than that of the related-art structure without the hard mask film 13.

A material containing silicon (Si) or a material containing tantalum (Ta) can be used as such hard mask film 13. An example of the material containing silicon (Si), which is suitable for the hard mask film 13, is a material containing silicon (Si) and one or more elements selected from oxygen (O), nitrogen (N), carbon (C), boron (B), and hydrogen (H). Another example of the material containing silicon (Si), which is suitable for the hard mask film 13, is a material containing silicon (Si), a transition metal, and one or more elements selected from oxygen (O), nitrogen (N), carbon (C), boron (B), and hydrogen (H). In addition, examples of the transition metal include molybdenum (Mo), tungsten (W), titanium (Ti), tantalum (Ta), zirconium (Zr), hafnium (Hf), niobium (Nb), vanadium (V), cobalt (Co), chromium (Cr), nickel (Ni), ruthenium (Ru), and tin (Sn).

Meanwhile, an example of the material containing tantalum (Ta), which is suitable for hard mask film 13, is a material containing tantalum (Ta) and one or more elements selected from oxygen (O), nitrogen (N), carbon (C), boron (B), and hydrogen (H). Among others, a material containing tantalum (Ta) and oxygen (O) is particularly preferred. Specific examples of such material include tantalum oxide (TaO), tantalum oxynitride (TaON), tantalum borate (TaBO), and tantalum boron oxynitride (TaBON).

Moreover, it is preferred that the hard mask film 13 be formed of a material containing oxygen (O) in addition to silicon (Si). Such hard mask film 13 has sufficient etching selectivity relative to the light shielding film 11, which is formed of a material containing chromium (Cr), and the hard mask film 13 may be removed by etching while hardly damaging the light shielding film 11.

Specific examples of the material forming such hard mask film 13 include silicon oxide ($SiO_2$), silicon nitride (SiN), and silicon oxynitride (SiON). The hard mask film 13 tends to be low in adhesion with the resist film made of the organic-based material, and hence it is preferred to perform hexamethyldisilazane (HMDS) processing on a front surface of the hard mask film 13 to improve the adhesion of the front surface.

<Resist Film 15>

In the mask blank 1 according to this invention, it is preferred that the resist film 15 made of the organic-based material be formed to have a film thickness of 100 nm or less in contact with the front surface of the hard mask film 13. In the case of a fine pattern compatible with the DRAM hp 32 nm generation, a sub-resolution assist feature (SRAF) having a line width of 40 nm may be provided in the light shielding pattern that is to be formed in the light shielding film 11. However, also in this case, as described above, as a result of providing the hard mask film 13, the film thickness of the resist film 15 may be suppressed, and as a consequence, a cross-sectional aspect ratio of the resist pattern formed of the resist film 15 may be set as low as 1:2.5. Therefore, collapse or detachment of the resist pattern during the development, rinsing, and the like of the resist film 15 may be suppressed. It is more preferred that the resist film 15 have the film thickness of 80 nm or less.

<Procedure of Manufacturing Mask Blank 1>

The mask blank 1 having the above-mentioned structure is manufactured through the following procedure. First, the transparent substrate 10 is prepared. The transparent substrate 10 is a substrate having its end surfaces and main surface S polished to a predetermined surface roughness, and then being subjected to predetermined cleaning processing and drying processing.

Next, on the transparent substrate 10, the lower layer 11a, the intermediate layer 11b, and the upper layer 11c of the light shielding film 11 are formed in the stated order by the sputtering method, and then the hard mask film 13 is formed by the sputtering method. In the film formation of each layer by the sputtering method, sputtering targets containing materials forming each layer in a predetermined composition ratio and a sputtering gas are used, and further, film formation using an inert gas, such as argon (Ar), helium (He), or the like, as a sputtering gas is performed. To the light shielding film 11, there may be applied a film forming method using the following two targets: a chromium target and a target containing indium and other such metallic elements (target formed only of indium and other such metallic elements or target formed of both elements of chromium and indium and other such metallic elements).

Thereafter, when the mask blank 1 includes the resist film 15, the HMDS processing is performed on the front surface of the hard mask film 13. Then, on the front surface, which has been subjected to the HMDS processing, of the hard mask film 13, the resist film 15 is formed by an application method, such as spin coating, to complete the mask blank 1.

<<Mask Blank According to Second Embodiment>>

Figure 2:
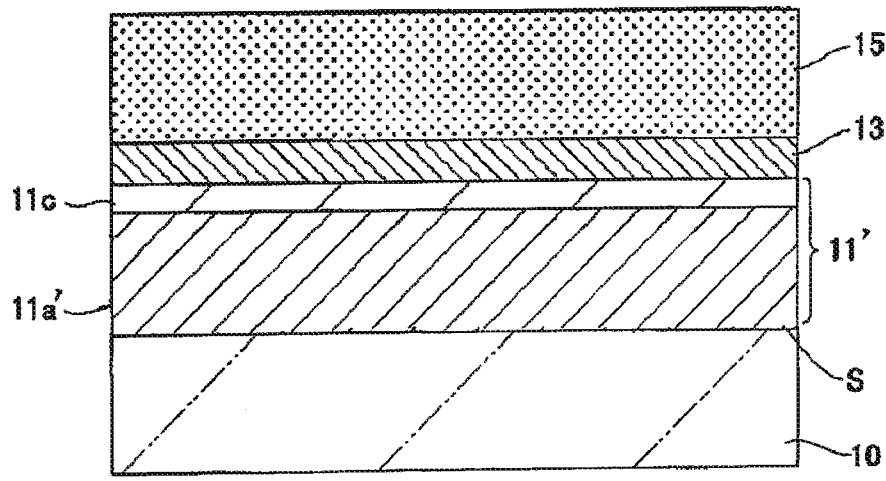
FIG. 2 is a cross-sectional view for illustrating the structure of a mask blank according to a second embodiment of this invention.

FIG. 2 is a cross-sectional view of a main part of a mask blank 2 according to a second embodiment of this invention. The mask blank 2 illustrated in this figure is different from the mask blank according to the first embodiment in the structure of a light shielding film 11', and the other structures are similar to the first embodiment. Therefore, only the structure of the light shielding film 11' is described here, and a duplicate description is omitted.

<Light Shielding Film 11'>

The light shielding film 11' in the mask blank 2 according to the second embodiment is different from the light shielding film in the mask blank according to the first embodiment in that, while the light shielding film in the first embodiment has the three-layer structure, the light shielding film 11' in the second embodiment has the following two-layer structure: a lower layer 11a' and an upper layer 11c, and is similar to the first embodiment in the optical density (OD) and the other structures. As with the light shielding film in the first embodiment, such light shielding film 11' having the two-layer laminated structure is formed of a material containing chromium (Cr), and further contains at least one metallic element selected from indium (In), tin (Sn), and molybdenum (Mo) (indium and other such metallic elements).

Of the structure, the lower layer 11a' is a layer corresponding to the lower layer 11a and the intermediate layer 11b of the mask blank 1 according to the first embodiment illustrated in FIG. 1, and has a graded composition in which a content of chromium (Cr) becomes higher from a side of the transparent substrate 10 (transparent 10 side) toward a side of the upper layer 11c (upper layer 11c side). The upper layer 11c side of the lower layer 11a' has the highest content of chromium in all layers of the light shielding film 11 including the upper layer 11c. In addition, at least the upper layer 11c side of the lower layer 11a' contains at least one metallic element selected from indium, tin, and molybdenum (indium and other such metallic elements). As a result, the etching rate may be increased while suppressing the reduction in optical density (OD) of the entire light shielding film 11'. The content of indium and other such metallic elements in the region on the upper layer 11c side of the lower layer 11a' is set in consideration of a total optical density (OD) of the light shielding film 11', but when the entire light shielding film 11' contains indium and other such metallic elements, the region on the upper layer 11c side of the lower layer 11a' has the highest content of indium and other such metallic elements.

The light shielding film 11' in this second embodiment has a higher reflectance on the back surface side of the light shielding film with respect to the exposure light than the light shielding film 11 in the first embodiment. Moreover, the light shielding film 11' in this second embodiment has a gentler shape of the side walls in a thickness direction than the light shielding film 11 in the first embodiment when a pattern is formed by dry etching.

The lower layer 11a' is required to have a thickness of 65 nm or less, preferably 60 nm or less, and more preferably 55 nm or less. The region on a side of the transparent substrate 10 (transparent substrate 10 side) of the lower layer 11a' is required to have a content of chromium of 35 at % or more, preferably 40 at % or more, and more preferably 45 at % or more. The region on the transparent substrate 10 side of the lower layer 11a' is also required to have the content of chromium of 55 at % or less, and preferably 50 at % or less.

The region on the transparent substrate 10 side of the lower layer 11a' may contain indium and other such metallic elements. However, the region on the transparent substrate 10 side of the lower layer 11a' contains indium and other such metallic elements, if any, in an amount that is smaller than that in the region on the upper layer 11c side of the lower layer 11a', and may contain no indium and other such metallic elements (the phrase "containing no indium and other such metallic elements" as used herein means that indium and other such metallic elements are included by contamination or the like in an allowable content, and that the region on the transparent substrate 10 side of the lower layer 11a' is allowed to have a content of indium and other such metallic elements in a range of 1 at % or less, for example).

The region on the upper layer 11c side of the lower layer 11a' is required to have a ratio M/(M+Cr) [%] of a total content M [at %] of indium and other such metallic elements to a total content (Cr+M) [at %] of chromium and indium and other such metallic elements of 5% or more, preferably 7% or more, and more preferably 10% or more. This is because the etching rate with respect to the dry etching using the chlorine-based gas containing oxygen is improved. Meanwhile, the region on the upper layer 11c side of the lower layer 11a' is required to have M/(M+Cr) [%] of 50% or less, preferably 30% or less, and more preferably 20% or less. This is because indium and other such metallic elements M are less resistant to chemical cleaning or cleaning with hot water than chromium.

The region on the upper layer 11c side of the lower layer 11a' is required to have a content of chromium of more than 55 at %, preferably 60 at % or more, and more preferably 65 at % or more. The region on the upper layer 11c side of the lower layer 11a' is also required to have the content of chromium of 85 at % or less, preferably 80 at % or less, and more preferably at 75% or less.

The region on the upper layer 11c side of the lower layer 11a' is required to have a thickness of 30 nm or less, preferably 25 nm or less, and more preferably 20 nm or less. The region on the upper layer 11c side of the lower layer 11a' is required to have the thickness of 5 nm or more, preferably 10 nm or more, and more preferably 15 nm or more.

The upper layer 11c has a structure that is similar to that in the first embodiment, and has the lowest content of chromium in the light shielding film 11'. Moreover, the upper layer 11c has the highest content of oxygen in the light shielding film 11'. Such upper layer 11c is provided so that, as in the first embodiment, the upper layer 11c functions as an antireflection layer of the light shielding film 11'. The upper layer 11c may contain indium and other such metallic elements as well as the material containing chromium, but when the upper layer contains such indium and other such metallic elements, the upper layer 11c is required to have a total content of indium and other such metallic elements that is lowest in the light shielding film 11 as in the first embodiment.

<Procedure of Manufacturing Mask Blank 2>

A procedure of manufacturing the mask blank 2 having the above-mentioned structure is similar to that in the first embodiment up to the step of preparing the transparent substrate 10 on which the cleaning processing and the drying processing have been performed after the polishing. Next, the lower layer 11a' is formed on the transparent substrate 10 by a sputtering method. At this time, a film forming apparatus is controlled to obtain a graded composition film in which a content of indium and other such metallic elements in the region on the transparent substrate 10 side of the lower layer 11a' is higher than a content of indium and other such metallic elements in the region on the upper layer 11c side. More specifically, first, the transparent substrate 10 is installed on a rotary table in a sputtering chamber, in which the following two targets: a chromium target and a target containing indium and other such metallic elements (target formed only of indium and other such metallic elements or target formed of both elements of chromium and indium and other such elements) are disposed. Then, in the sputtering chamber, a film forming gas is introduced, and further, voltages are applied to both of the two targets to form the region on the transparent substrate 10 side of the lower layer 11a' on the transparent substrate 10 by sputtering.

In the film formation by the sputtering, from the start of the film formation of the region on the transparent substrate 10 side in the lower layer 11a' to the end of the film formation of a front surface of the region on the upper layer 11c side in the lower layer 11a', the voltage applied to the target containing indium and other such metallic elements is gradually increased. In this manner, the lower layer 11a' may be a graded composition film in which the content of indium and other such metallic elements is increased from the transparent substrate 10 side to the upper layer 11c side. Moreover, during the film formation of the lower layer 11a' by the sputtering, in the course of the film formation by the sputtering, an adjustment, such as changing flow rates of a rare gas and a reactive gas of the film forming gas, may be made. After the film formation of the lower layer 11a', each of the upper layer 11c and the hard mask film 13 is formed in a procedure similar to that in the first embodiment. Moreover, when the mask blank 2 includes a resist film 15, the resist film 15 is formed by application in a procedure similar to that in the first embodiment. Through the above-mentioned procedure, the mask blank 2 is produced.

<<Method of Manufacturing Phase Shift Mask, and Phase Shift Mask>>

A method of manufacturing a phase shift mask according to the present invention is a method of manufacturing a phase shift mask using the mask blank according to the first embodiment, which has been described with reference to FIG. 1, or a method of manufacturing a phase shift mask using the mask blank according to the second embodiment, which has been described with reference to FIG. 2. Now, the method of manufacturing the phase shift mask is described with reference to FIG. 3 and FIG. 4. In FIG. 3A to FIG. 3C and FIG. 4A to FIG. 4C, the mask blank according to the first embodiment, which has been described with reference to FIG. 1, is described, but the production method to be described with reference to FIG. 3A to FIG. 3C and FIG. 4A to FIG. 4C is equally applied to the case where the mask blank according to the second embodiment, which has been described with reference to FIG. 2, is used.

Figure 3A:
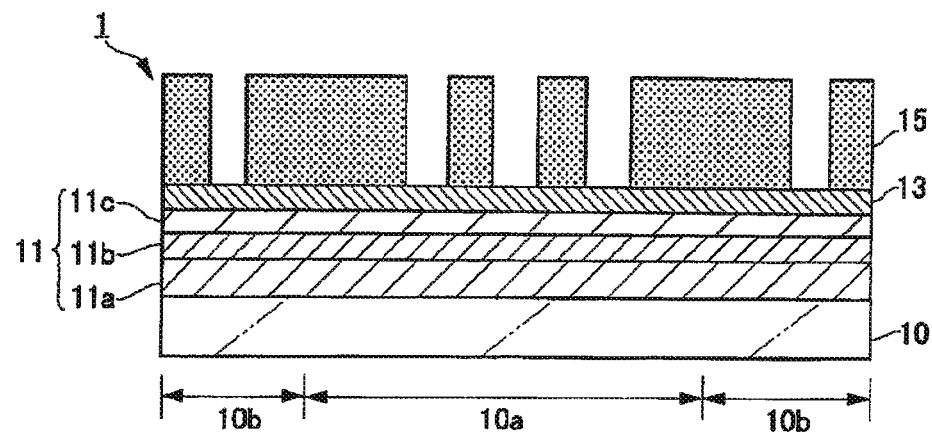
FIG. 3A is a view of one production step for illustrating a method of manufacturing a phase shift mask according to this invention.

First, as illustrated in FIG. 3A, on the resist film 15 of the mask blank 1, the light shielding pattern, which is to be formed in the light shielding film 11, is drawn by exposure. At this time, a center portion of the transparent substrate 10 is a phase shift pattern forming region (transfer pattern forming region) 10a, in which the light shielding pattern forming the phase shift pattern is exposure-drawn (in the phase shift mask according to this invention, the phase shift pattern is formed of the light shielding pattern and the digging pattern). Moreover, in a peripheral region 10b of the phase shift pattern forming region 10a, a light shielding pattern forming an alignment pattern is drawn by exposure. For exposure drawing, an electron beam is often used. Thereafter, the resist film 15 is subjected to predetermined processing, such as PEB processing, development processing, and post-baking processing, to form the light shielding pattern and the alignment pattern in the resist film 15.

Figure 3B:
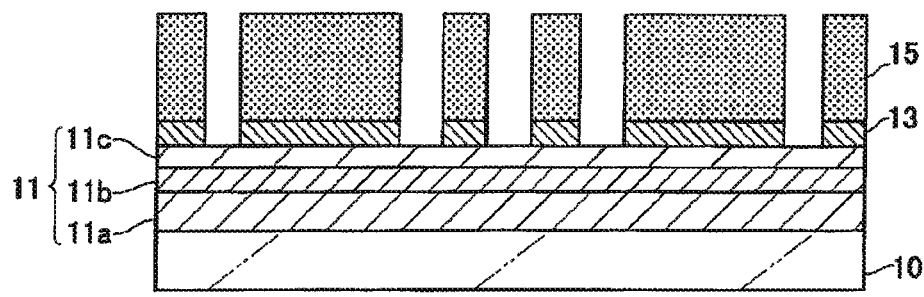
FIG. 3B is a view of one production step for illustrating the method of manufacturing a phase shift mask according to this invention.

Next, as illustrated in FIG. 3B, the hard mask film 13 is dry-etched using the fluorine-based gas and using as a mask the resist film 15, in which the light shielding pattern and the alignment pattern have been formed, to form the light shielding pattern and the alignment pattern in the hard mask film 13. Thereafter, the resist film 15 is removed. In this example, the light shielding film 11 may be dry-etched with the resist film 15 being left without being removed. Also in this case, in the course of the dry etching of the light shielding film 11, the resist film 15 disappears.

Figure 3C:
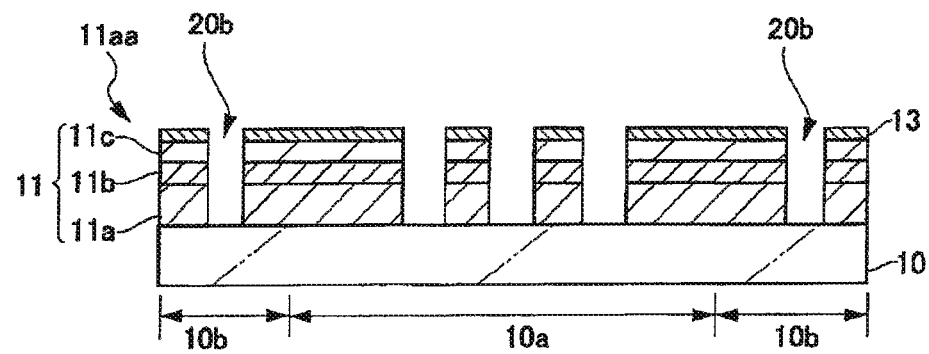
FIG. 3C is a view of one production step for illustrating the method of manufacturing a phase shift mask according to this invention.

Next, as illustrated in FIG. 3C, the light shielding film 11 is dry-etched using a mixture gas of a chlorine-based gas and an oxygen gas (chlorine-based gas containing oxygen) and using as a mask the hard mask film 13, in which the light shielding pattern and the alignment pattern have been formed, to pattern the light shielding film 11 containing at least one metallic element selected from indium, tin, and molybdenum (indium and other such metallic elements) as well as chromium. For the dry etching using the chlorine-based gas containing oxygen at this time, an etching gas having a higher mixture ratio of the chlorine-based gas than in the related art is used. The mixture ratio of the mixture gas of the chlorine-based gas and the oxygen gas in the dry etching of the light shielding film 11 in terms of a ratio of gas flow rates in an etching apparatus, which is expressed as a ratio of the chlorine-based gas to the oxygen gas, is preferably 10 or more to 1, more preferably 15 or more to 1, and further preferably 20 or more to 1. This is for increasing anisotropy of the dry etching using the chlorine-based gas containing oxygen. Moreover, the mixture ratio of the mixture gas of the chlorine-based gas and the oxygen gas in the dry etching of the light shielding film 11 in terms of a ratio of gas flow rates in an etching chamber, which is expressed as a ratio of the chlorine-based gas to the oxygen gas, is preferably 40 or less to 1.

Moreover, in the dry etching of the light shielding film 11 using the chlorine-based gas containing oxygen, a bias voltage applied from the back surface side of the transparent substrate is also set higher than in the related art. Depending on the etching apparatus, there is a difference in effect of increasing the bias voltage, but as an example, an electric power when the bias voltage is applied is preferably 15 [W] or more, more preferably 20 [W] or more, and further preferably 30 [W] or more. This is for increasing the anisotropy of the dry etching using the chlorine-based gas containing oxygen. In this manner, a light shielding pattern 11aa formed of the light shielding film 11 is formed. The light shielding pattern 11aa includes a light shielding pattern in the phase shift pattern forming region 10a, and includes a hole-shaped alignment pattern 20b in the peripheral region 10b.

Figure 4A:
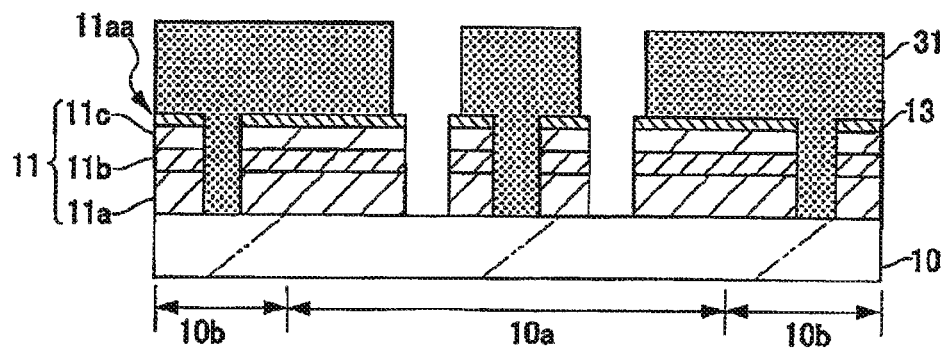
FIG. 4A is a view of one production step for illustrating the method of manufacturing a phase shift mask according to this invention.

Next, as illustrated in FIG. 4A, on the hard mask film 13, in which the light shielding pattern 11aa has been formed, a resist film 31, in which the digging pattern is formed, is formed. At this time, on the transparent substrate 10, the resist film 31 is formed first by spin coating. The resist film 31 is formed to have such a thickness that, at the end of the dry etching using the fluorine-based gas, which is performed when the digging pattern is formed in the transparent substrate 10 as the next step, the resist film 31 and the hard mask film 13 on the hard mask film 13 themselves disappear, but the resist film 31 filled among patterns of the light shielding pattern 11aa remains at least to an extent that does not expose the main surface S of the transparent substrate 10. Next, patterning and exposure are performed on the applied resist film 31, and further, predetermined processing, such as development processing, is performed. In this manner, in the phase shift pattern forming region 10a of the resist film 31, the digging pattern, in which the transparent substrate 10 is exposed, is formed, and the resist film 31 having the digging pattern is formed. In this example, the digging pattern is formed in the resist film 31 to have an aperture width with a margin for lithography misalignment so that apertures of the digging pattern formed in the resist film 31 fully expose apertures of the light shielding pattern 11aa.

Figure 4B:
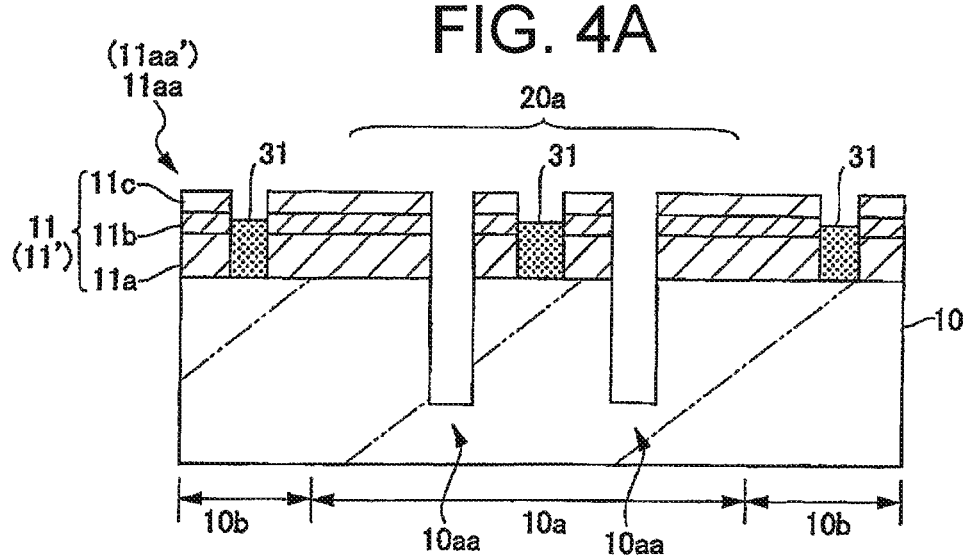
FIG. 4B is a view of one production step for illustrating the method of manufacturing a phase shift mask according to this invention.

Next, as illustrated in FIG. 4B, the transparent substrate 10 is dry-etched using a fluorine-based gas, and using as masks the resist film 31, which has the digging pattern, and the light shielding film 11, in which the light shielding pattern 11aa has been formed. In this manner, the digging pattern 10aa is formed in the phase shift pattern forming region 10a on one main surface S side of the transparent substrate 10. This digging pattern 10aa is formed so that it has a depth that shifts a phase by a half period from the exposure light used in the exposure step of the lithography using the phase shift mask obtained in this example. For example, when the ArF excimer laser light is applied to the exposure light, the digging pattern 10aa which has a depth of about 173 nm is formed.

Moreover, in the course of the dry etching using the fluorine-based gas, the resist film 31 is gradually eroded or becomes thin, and the resist film 31 on the hard mask film 13 all disappears. Further, the hard mask film 13 also disappears by the dry etching using the fluorine-based gas. In this manner, a phase shift pattern 20a formed of the light shielding pattern 11aa and the digging pattern 10aa formed in the transparent substrate 10, is formed in the phase shift pattern forming region 10a. Thereafter, the remaining resist film 31 is removed.

Figure 4C:
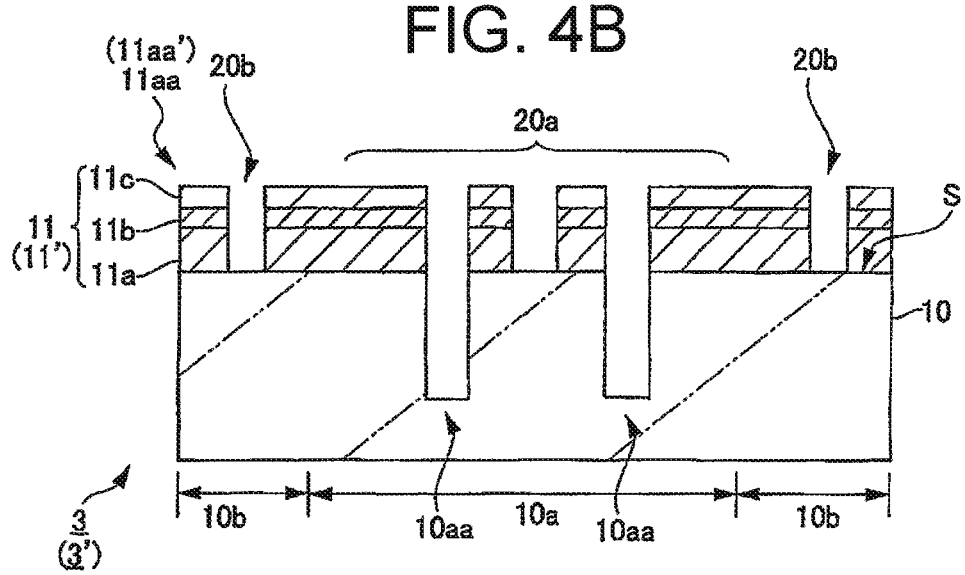
FIG. 4C is a view of one production step for illustrating the method of manufacturing a phase shift mask according to this invention.

As described above, a phase shift mask 3 as illustrated in FIG. 4C is obtained. The thus-obtained phase shift mask 3 has the structure in which the digging pattern 10aa is formed on a side of the one main surface S (main surface S side) of the transparent substrate 10, and in which the light shielding film 11, which has the light shielding pattern 11aa, is laminated on the main surface S of the transparent substrate 10. The digging pattern 10aa is formed on the main surface S side of the transparent substrate 10 in a state of being in continuation of bottom portions of the apertures of the light shielding pattern 11aa in the phase shift pattern forming region 10a of the transparent substrate 10. There is obtained a state in which the phase shift pattern 20a formed of the digging pattern 10aa and the light shielding pattern 11aa is arranged in the phase shift pattern forming region 10a. There is also obtained a state in which the hole-shaped alignment pattern 20b, which pierces through the light shielding film 11, is provided in the peripheral region 10b.

The chlorine-based gas used in the dry etching in the above-mentioned production process is not particularly limited as long as Cl is contained. Examples of the chlorine-based gas include $Cl_2$, $SiCl_2$, $CHCl_3$, $CH_2Cl_2$, $CCl_4$, $BCl_3$, and the like. Moreover, as the fluorine-based gas used in the dry etching in the above-mentioned production process is not particularly limited as long as F is contained. Examples of the fluorine-based gas include $CHF_3$, $CF_4$, $C_2F_6$, $C_4F_8$, $SF_6$, and the like.

In the method of manufacturing the phase shift mask, which has been described above, the phase shift mask is produced using the mask blank 1, which has been described with reference to FIG. 1. In the production of such phase shift mask, in the step of dry-etching the light shielding film 11 made of the material containing chromium, which has been described with reference to FIG. 3C, the dry etching which uses the chlorine-based gas containing oxygen and which has a tendency of isotropy etching is applied. However, the dry etching using the chlorine-based gas containing oxygen in the step of FIG. 3C is performed under etching conditions wherein a ratio of the chlorine-based gas in the chlorine-based gas containing oxygen is high, and wherein a high bias voltage is applied. The upper layer 11c, for which the content of chromium is set low to impart the antireflection function, is in a state in which, as the etching time becomes longer, side etching occurs more easily.

However, the intermediate layer 11b of the light shielding film 11 has the structure containing at least one of indium and other such metallic elements, which is selected from indium, tin, and molybdenum, although the highest content of chromium in the light shielding film 11 is provided in the intermediate layer 11b for the purpose of securing the light shielding property. Therefore, as compared to the intermediate layer having the structure for securing the optical density (OD) only with the adjustment of the density of chromium, the intermediate layer 11b is a layer in which the etching rate is increased with the high optical density (OD) kept high.

In this manner, the etching rate for the entire light shielding film 11 is reduced, and a progress of the side etching in the upper layer 11c, for which the content of chromium is set low, may be suppressed to a small level. As a result, the upper layer 11c may be patterned with a small divergence from a pattern shape of the hard mask film 13.

Moreover, the lower layer 11a has a content of chromium that is lower than that of the intermediate layer 11b, but is not low as compared with the content of chromium of the upper layer 11c, and serves to impart the antireflection function, and hence the etching rate is kept high. However, since the etching rate of the intermediate layer 11b becomes high, over-etching time in patterning the light shielding film 11 is reduced. As a result, the side etching in the lower layer 11a is reduced. The above-mentioned effects are achieved in connection with the lower layer 11a, the intermediate layer 11b, and the upper layer 11c of the light shielding film 11 and therefore, the shape of the side walls of the pattern in the light shielding film 11, which is formed by the dry etching using the chlorine-based gas containing oxygen, becomes satisfactory.

<<Method of Manufacturing Semiconductor Device>>

A method of manufacturing a semiconductor device according to this invention has a feature that a transfer pattern (phase shift pattern) of a phase shift mask is transferred by exposure on the resist film on the substrate using the phase shift mask, or the phase shift mask 3 produced by the method of manufacturing the phase shift mask, which has been described above. Such method of manufacturing the semiconductor device is performed as follows.

First, a substrate, on which the semiconductor device is to be formed, is prepared. This substrate may be a semiconductor substrate or a substrate with a semiconductor thin film, or the semiconductor substrate or the substrate with the semiconductor film on which a finely processed film is further formed, for example. A resist film is formed on the prepared substrate, and the resist film is subjected to patterning and exposure using the phase shift mask 3 according to this invention so that a transfer pattern (phase shift pattern 20a), which is formed in the phase shift mask 3, is transferred by exposure on the resist film. At this time, exposure light compatible with the digging pattern 10aa is used as exposure light, and in this example, an ArF excimer laser light is used, for example.

Thereafter, the resist film, on which the transfer pattern has been transferred by the exposure, is subjected to development processing to form a resist pattern, and processing of performing etching processing on and introducing impurities to a surface layer of the substrate is performed using the resist pattern as a mask. After the processing is ended, the resist pattern is removed.

The processing as described above is repeatedly performed on the substrate while replacing transfer masks, and necessary processing is further performed to complete the semiconductor device.

In the production of the semiconductor device as described above, the phase shift mask, or the phase shift mask in which the phase shift pattern has good form accuracy and which has been produced by the method of manufacturing the phase shift mask according to this invention is used to perform lithography. Consequently, there can be formed a resist pattern having an accuracy that sufficiently satisfies initial design specifications on the substrate. As a result, when a lower film is dry-etched using the pattern of the resist film as a mask to form a circuit pattern, a highly accurate circuit pattern can be formed without short-circuit or disconnection of wirings, which is attributed to inadequate accuracy.

EXAMPLES

Now, the embodiments of this invention are described more specifically by means of Examples.

Example 1

Production of Mask Blank

A mask blank 1 in Example 1 of this invention according to the configuration, which has been described with reference to FIG. 1, was produced as follows. First, a transparent substrate 10, which was made of synthetic quartz glass having dimensions of one main surface S of about 152 mm by about 152 mm and a thickness of about 6.25 mm, was prepared. The transparent substrate 10 was a substrate having its end surfaces and main surface S polished to a predetermined surface roughness, and then being subjected to predetermined cleaning processing and drying processing.

On the transparent substrate 10, the light shielding film 11 was formed in order of the lower layer 11a, the intermediate layer 11b, and the upper layer 11c. More specifically, the transparent substrate 10 was placed on a substrate stage in a DC sputtering apparatus, and a CrOCN film (having a film composition ratio of CrO:C:N=48:9:27:16 at %) was formed as the lower layer 11a to have a thickness of 38 nm by DC sputtering using a Cr target as a sputtering target, and using as a sputtering gas a mixture gas of Ar, $CO_2$, $N_2$, and He. The composition of the CrOCN film is a value obtained by analysis by X-ray photoelectron spectroscopy. The same is true for the following description.

Next, on the lower layer 11a of the transparent substrate 10, a CrInON film (having a film composition ratio of Cr:In:O:N=77:9:8:6 at %) was formed as the intermediate layer 11b to have a thickness of 15 nm by DC sputtering using a mixed CrIn target (having a ratio of Cr:In=90:10 at %) as a sputtering target, and using as a sputtering gas a mixture gas of Ar, NO, and He.

Next, on the intermediate layer 11b of the transparent substrate 10, a CrOCN film (having a film composition ratio of CrO:C:N=31:16:37:16 at %) was formed as the upper layer 11c to have a thickness of 14 nm by DC sputtering using a Cr target as a sputtering target, and using as a sputtering gas a mixture gas of Ar, $CO_2$, $N_2$, and He.

After the lower layer 11a, the intermediate layer 11b, and the upper layer 11c were formed by sputtering in the stated order on the transparent substrate 10, when an optical density (OD) with respect to the wavelength (about 193 nm) of the ArF excimer laser light was measured for the laminated structure of the light shielding film 11, the optical density (OD) was 3.0 or more. A reflectance (front surface reflectance) on the upper layer 11c side with respect to the wavelength of the ArF excimer laser light, which was measured for the light shielding film 11, was 22%. Moreover, a reflectance (back surface reflectance) on the lower layer 11a side with respect to the wavelength of the ArF excimer laser light, which was measured for the light shielding film 11, was 20%.

Moreover, when a light transmittance of the light shielding film 11 with respect to light having a wavelength of 880 nm, which was used in positioning of the exposure apparatus, was measured before the hard mask film 13 was formed on the light shielding film 11 by sputtering, the light transmittance was 50% or less.

Next, the hard mask film 13 was formed on the light shielding film 11. More specifically, the transparent substrate 10 on which the light shielding film 11 was formed was placed on the substrate stage in the DC sputtering apparatus, and a SiON film (having a film composition ratio of Si:O:N=37:44:19 at %) was formed as the hard mask film 13 to have a thickness of 10 nm by DC sputtering using a Si target as a sputtering target, and using as a sputtering gas a mixture gas of Ar, $N_2$, $O_2$, and He.

After the above-mentioned film formation by the sputtering, HMDS processing was performed on the front surface of the hard mask film 13. Subsequently, a resist film 15 made of a chemical amplification resist for electron beam lithography (PRL 009 manufactured by FUJIFILM Electronic Materials Co., Ltd.) was formed to have a film thickness of 100 nm in contact with the front surface of the hard mask film 13 by spin coating. Through the above-mentioned procedure, the mask blank 1, which had the structure wherein the light shielding film 11 having the three-layer structure, the hard mask film 13, and the resist film 15 were laminated in the stated order, was produced on the transparent substrate 10.

A phase shift mask 3 in Example 1 was produced through the following procedure using the produced mask blank 1 in Example 1. First, referring to FIG. 3A, on the resist film 15, the light shielding pattern, which is to be formed in the hard mask film 13, was drawn by electron beam lithography. The resist film 15 was then subjected to predetermined development processing and cleaning processing to form the light shielding pattern and the alignment pattern (those patterns are hereinafter collectively referred to as "light shielding pattern, etc.").

Next, as illustrated in FIG. 3B, the hard mask film 13 was dry-etched using a fluorine-based gas ($CF_4$) and using as a mask the resist film 15 having a light shielding pattern, etc. to form the light shielding pattern, etc. in the hard mask film 13. Thereafter, the resist film 15 was removed. Next, as illustrated in FIG. 3C, the light shielding film 11 was dry-etched (bias voltage of 30 [W]) using a mixture gas of a chlorine gas ($Cl_2$) and an oxygen gas ($O_2$) (gas flow rate of $Cl_2:O_2$=20:1) and using as a mask the hard mask film 13 having the light shielding pattern, etc. to form the light shielding pattern 11aa. At this time, as to an etching rate of the dry etching in each layer of the light shielding film 11, a ratio of an etching rate of the intermediate layer 11b was equal to 0.5 when an etching rate of the upper layer 11c was set to 1. Moreover, a ratio of an etching rate of the lower layer 11a was 0.6 when the etching rate of the upper layer 11c was set to 1.

Next, as illustrated in FIG. 4A, on the hard mask film 13, in which the light shielding pattern 11aa had been formed, the resist film 31, in which the digging pattern was formed, was formed. More specifically, in contact with the front surface of the hard mask film 13, the resist film 31 made of a chemical amplification resist for electron beam lithography (PRL 009 manufactured by FUJIFILM Electronic Materials Co., Ltd.) was formed by spin coating to have a thickness of 50 nm. This film thickness is a film thickness on the hard mask film 13. Next, the digging pattern was drawn by electron beam lithography on the resist film 31, and predetermined development processing and cleaning processing were performed to form the resist film 31 having the digging pattern. At this time, the digging pattern was formed in the resist film 31 to have the aperture width with the margin for the lithography misalignment so that the apertures of the digging pattern formed in the resist film 31 fully exposed the apertures of the light shielding pattern 11aa.

Thereafter, as illustrated in FIG. 4B, the transparent substrate 10 was dry-etched using a fluorine-based gas ($CF_4$) and using as masks the resist film 31, which had the digging pattern, and the light shielding film 11, in which the light shielding pattern 11aa had been formed. In this manner, the digging pattern 10aa was formed to have a depth of 173 nm in the phase shift pattern forming region 10a on one main surface S side of the transparent substrate 10. Also, in the course of the dry etching using the fluorine-based gas, the resist film 31 was gradually eroded, and the resist film 31 on the hard mask film 13 all disappeared. Further, the hard mask film 13 was also removed by the dry etching using the fluorine-based gas. Then, the remaining resist film 31 was removed, and cleaning and other such processing were performed to obtain the phase shift mask 3.

[Evaluation of Light Shielding Pattern 11aa]

Figure 5:
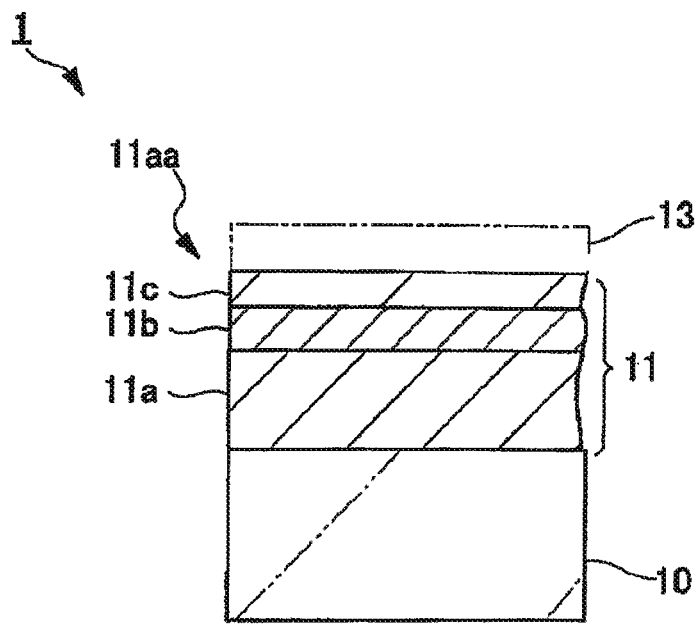
FIG. 5 is a cross-sectional view for illustrating a pattern formed in Example 1 of this invention.

In the phase shift mask 3 in Example 1 produced through the above-mentioned procedure, a cross-sectional shape of the light shielding pattern 11aa was checked. As a result, as illustrated in FIG. 5, no significant erosion was found, that is, the amount of side etching was small, in etched side walls of the upper layer 11c and the lower layer 11a in the light shielding pattern 11aa. Moreover, the erosion of the cross section of the light shielding pattern 11as with respect to the dimensions of the patterned hard mask film 13 was small.

[Evaluation of Digging Pattern 10Aa]

When a shape of the digging pattern 10aa, which had been formed by etching the transparent substrate 10 using the resist film 31 and the light shielding pattern 11aa as masks, was evaluated, it was confirmed that a pattern shape with a small divergence from a planar shape of the patterned hard mask film was obtained.

Moreover, AIMS 193 (manufactured by Carl Zeiss AG) was used on the phase shift mask 3 in Example 1 of this invention to perform a simulation of a transfer image when transferred by exposure to exposure light having a wavelength of 193 nm on the resist film on the semiconductor device. When the image transferred by the exposure in the simulation was examined, the design specifications were sufficiently satisfied. This result shows that even when the phase shift mask 3 in Example 1 is set on a mask stage of an exposure apparatus, and when the resist film on the semiconductor device is subjected to the transferring by the exposure, a circuit pattern to be finally formed on the semiconductor device can be formed with high accuracy.

Example 2

Production of Mask Blank

A mask blank in Example 2 of this invention according to the mask blank 2 in the second embodiment, which has been described with reference to FIG. 2, was produced in a procedure similar to that of the mask blank in Example 1. It should be noted, however, that for the sputter deposition of the light shielding film 11', there was used a sheet-type film forming apparatus using a DC sputtering method, in which the following two targets: a chromium (Cr) target and an indium (In) target were provided in a film forming chamber, and which was capable of applying voltages to the two targets at the same time. For the lower layer 11a', there was used a method in which sputtering deposition of the lower layer 11a' was started in a state in which the voltage was applied only to the chromium target, and in which the voltage applied to the indium target was gradually increased. As the sputtering gas at this time, a mixture gas of argon, helium, nitrogen, and carbon dioxide was used. As a result, the lower layer 11a' was formed to have the layer structure having the graded composition from the transparent substrate 10 side (having a composition ratio of CrO:C:N=47:11:28:14 at %) to the upper layer 11c side (having a composition ratio of CrIn:O:C:N=73:10:5:8:4 at %).

Moreover, for the upper layer 11c (CrOCN film having a film composition ratio of CrO:C:N=31:16:37:16 at %) of the light shielding film 11', there was performed sputter deposition in which the voltage is applied only to the chromium target, and which uses a mixture gas of argon, helium, nitrogen, and carbon dioxide as a sputtering gas.

After the lower layer 11a' and the upper layer 11c were formed by sputtering in the stated order on the transparent substrate 10, when an optical density (OD) with respect to the wavelength (about 193 nm) of the ArF excimer laser light was measured for the laminated structure of the light shielding film 11, the optical density (OD) was 3.0 or more. A reflectance (front surface reflectance) on the upper layer 11c side with respect to the wavelength of the ArF excimer laser light, which was measured for the light shielding film 11, was 20%. Moreover, a reflectance (back surface reflectance) on the lower layer 11a side with respect to the wavelength of the ArF excimer laser light, which was measured for the light shielding film 11, was 31%.

Moreover, when a light transmittance of the light shielding film 11 with respect to light having a wavelength of 880 nm, which was used in positioning of the exposure apparatus, was measured before the hard mask film 13 was formed on the light shielding film 11 by sputtering, the light transmittance was 50% or less.

[Pattern Formation]

A phase shift mask 3' in Example 2 was produced in a procedure similar to that in Example 1 using the produced mask blank 2 in Example 2. As for the etching rates of the dry etching in the respective layers of the light shielding film 11, a ratio of the etching rate of the lower layer 11a' was 0.6 when the etching rate of the upper layer 11c was set to 1.

[Evaluation of Light Shielding Pattern 11Aa']

Figure 6:
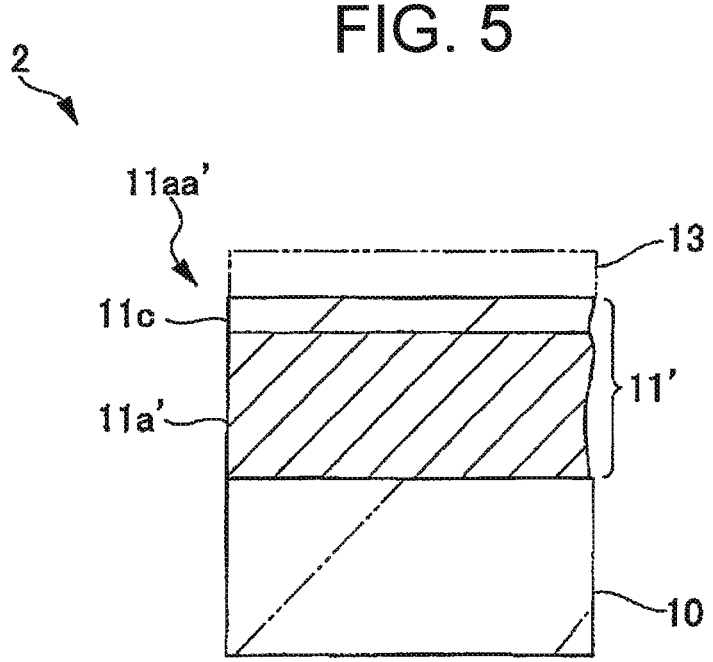
FIG. 6 is a cross-sectional view for illustrating a pattern formed in Example 2 of this invention.

In the phase shift mask 3' in Example 2 produced through the above-mentioned procedure, a cross-sectional shape of the light shielding pattern 11aa' was checked. As a result, as illustrated in FIG. 6, no significant erosion was found, that is, the amount of side etching was small, in etched side walls of the upper layer 11c and the lower layer 11a' in the light shielding pattern 11aa'. Moreover, the erosion of the cross section of the light shielding pattern 11aa' with respect to the dimensions of the patterned hard mask film 13 was small.

[Evaluation of Digging Pattern 10aa]

When a shape of the digging pattern 10aa, which had been formed by etching the transparent substrate 10 using the resist film 31 and the light shielding pattern 11aa' as masks, was evaluated, it was confirmed that a pattern shape with a small divergence from a planar shape of the patterned hard mask film was obtained.

Moreover, AIMS 193 (manufactured by Carl Zeiss AG) was used on the phase shift mask 3' in Example 2 of this invention to perform a simulation of a transfer image when transferred by exposure to exposure light having a wavelength of 193 nm on the resist film on the semiconductor device. When the image transferred by the exposure in the simulation was examined, the design specifications were sufficiently satisfied. This result shows that even when the phase shift mask 3' in Example 2 is set on a mask stage of an exposure apparatus, and when the resist film on the semiconductor device is subjected to the transferring by the exposure, a circuit pattern to be finally formed on the semiconductor device can be formed with high accuracy.

Example 3

Production of Mask Blank

As another Example of the mask blank 1 according to the first embodiment, which has been described with reference to FIG. 1, a mask blank according to Example 3 of this invention was produced in a procedure similar to that of the mask blank in Example 1. It should be noted, however, that for the intermediate layer 11b of the light shielding film 11, a CrSnON film (having a film composition ratio of Cr:Sn:O:N=75:10:8:7 at %) was formed as the intermediate layer 11b to have a thickness of 15 nm by DC sputtering using a mixed CrSn target (having a ratio of Cr:Sn=90:10 at %) as the sputtering target and using as a sputtering gas a mixture gas of Ar, NO, and He.

After the lower layer 11a, the intermediate layer 11b, and the upper layer 11c were formed by sputtering in the stated order on the transparent substrate 10, when an optical density (OD) with respect to the wavelength (about 193 nm) of the ArF excimer laser light was measured for the laminated structure of the light shielding film 11, the optical density (OD) was 3.0 or more. A reflectance (front surface reflectance) on the upper layer 11c side with respect to the wavelength of the ArF excimer laser light, which was measured for the light shielding film 11, was 21%. Moreover, a reflectance (back surface reflectance) on the lower layer 11a side with respect to the wavelength of the ArF excimer laser light, which was measured for the light shielding film 11, was 20%.

Moreover, when a light transmittance of the light shielding film 11 with respect to light having a wavelength of 880 nm, which was used in positioning of the exposure apparatus, was measured before the hard mask film 13 was formed on the light shielding film 11 by sputtering, the light transmittance was 50% or less.

[Pattern Formation]

A phase shift mask 3 in Example 3 was produced in a procedure similar to that in Example 1 using the produced mask blank 1 in Example 3. As for the etching rates of the dry etching in the respective layers of the light shielding film 11, a ratio of the etching rate of the intermediate layer 11b was 0.5 when the etching rate of the upper layer 11c was set to 1. Further, a ratio of the etching rate of the lower layer 11a was 0.6 when the etching rate of the upper layer 11c was set to 1.

[Evaluation of Light Shielding Pattern 11aa]

In the phase shift mask 3 in Example 3 produced through the above-mentioned procedure, a cross-sectional shape of the light shielding pattern 11aa was checked. As a result, as illustrated in FIG. 5, no significant erosion was found, that is, the amount of side etching was small, in etched side walls of the upper layer 11c and the lower layer 11a in the light shielding pattern 11aa. Moreover, the erosion of the cross section of the light shielding pattern 11aa with respect to the dimensions of the patterned hard mask film 13 was small.

[Evaluation of Digging Pattern 10aa]

When a shape of the digging pattern 10aa, which had been formed by etching the transparent substrate 10 using the resist film 31 and the light shielding pattern 11aa as masks, was evaluated, it was confirmed that a pattern shape with a small divergence from a planar shape of the patterned hard mask film was obtained.

Moreover, AIMS 193 (manufactured by Carl Zeiss AG) was used on the phase shift mask 3 in Example 3 to perform a simulation of a transfer image when transferred by exposure to exposure light having a wavelength of 193 nm on the resist film on the semiconductor device. When the image transferred by the exposure in the simulation was examined, the design specifications were sufficiently satisfied. This result shows that even when the phase shift mask 3 in Example 3 is set on a mask stage of an exposure apparatus, and when the resist film on the semiconductor device is subjected to the transferring by the exposure, a circuit pattern to be finally formed on the semiconductor device can be formed with high accuracy.

Example 4

Production of Mask Blank

As another Example of the mask blank 2 according to the second embodiment, which has been described with reference to FIG. 2, a mask blank according to Example 4 of this invention was produced in a procedure similar to that of the mask blank in Example 2. It should be noted, however, that for the sputter deposition of the lower layer 11a' of the light shielding film 11', there was used a sheet-type film forming apparatus using a DC sputtering method, in which the following two targets: a chromium (Cr) target and a tin (Sn) target were provided in a film forming chamber, and which was capable of applying voltages to the two targets at the same time. For the lower layer 11a', there was used a method in which sputtering deposition of the lower layer 11a' was started in a state in which the voltage was applied only to the chromium target, and in which the voltage applied to the tin target was gradually increased. As the sputtering gas at this time, a mixture gas of argon, helium, nitrogen, and carbon dioxide was used. As a result, the lower layer 11a' was formed to have the layer structure having the graded composition from the transparent substrate 10 side (having a composition ratio of CrO:C:N=47:12:27:14 at %) to the upper layer 11c side (having a composition ratio of Cr:Sn:O:C:N=71:11:6:8:4 at %).

After the lower layer 11a' and the upper layer 11c were formed by sputtering in the stated order on the transparent substrate 10, when an optical density (OD) with respect to the wavelength (about 193 nm) of the ArF excimer laser light was measured for the laminated structure of the light shielding film 11, the optical density (OD) was 3.0 or more. A reflectance (front surface reflectance) on the upper layer 11c side with respect to the wavelength of the ArF excimer laser light, which was measured for the light shielding film 11, was 21%. Moreover, a reflectance (back surface reflectance) on the lower layer 11a side with respect to the wavelength of the ArF excimer laser light, which was measured for the light shielding film 11, was 29%.

Moreover, when a light transmittance of the light shielding film 11 with respect to light having a wavelength of 880 nm, which was used in positioning of the exposure apparatus, was measured before the hard mask film 13 was formed on the light shielding film 11 by sputtering, the light transmittance was 50% or less.

[Pattern Formation]

A phase shift mask 3' in Example 4 was produced in a procedure similar to that in Example 1 using the produced mask blank 2 in Example 4. As for the etching rates of the dry etching in the respective layers of the light shielding film 11', a ratio of the etching rate of the lower layer 11a' was 0.6 when the etching rate of the upper layer 11c was set to 1.

[Evaluation of Light Shielding Pattern 11aa']

In the phase shift mask 3' in Example 4 produced through the above-mentioned procedure, a cross-sectional shape of the light shielding pattern 11aa was checked. As a result, as illustrated in FIG. 6, no significant erosion was found, that is, the amount of side etching was small, in etched side walls of the upper layer 11c and the lower layer 11a' in the light shielding pattern 11aa'. Moreover, the erosion of the cross section of the light shielding pattern 11aa' with respect to the dimensions of the patterned hard mask film 13 was small.

[Evaluation of Digging Pattern 10aa]

When a shape of the digging pattern 10aa, which had been formed by etching the transparent substrate 10 using the resist film 31 and the light shielding pattern 11aa' as masks, was evaluated, it was confirmed that a pattern shape with a small divergence from a planar shape of the patterned hard mask film was obtained.

Moreover, AIMS 193 (manufactured by Carl Zeiss AG) was used on the phase shift mask 3 in Example 4 to perform a simulation of a transfer image when transferred by exposure to exposure light having a wavelength of 193 nm on the resist film on the semiconductor device. When the image transferred by the exposure in the simulation was examined, the design specifications were sufficiently satisfied. This result shows that even when the phase shift mask 3 in Example 4 is set on a mask stage of an exposure apparatus, and when the resist film on the semiconductor device is subjected to the transferring by the exposure, a circuit pattern to be finally formed on the semiconductor device can be formed with high accuracy.

Comparative Example

Production of Mask Blank

A mask blank was produced through a procedure similar to that in Example 1 except that the intermediate layer of the light shielding film having the three-layer structure was changed to a CrN film (having a film composition ratio of Cr:N=85:15) having a thickness of 17 nm.

After the light shielding film was formed by sputtering on the transparent substrate, when an optical density (OD) with respect to the wavelength (about 193 nm) of the ArF excimer laser light was measured for the light shielding film, the optical density (OD) was 3.0 or more. A reflectance (front surface reflectance) on the upper layer side with respect to the wavelength of the ArF excimer laser light, which was measured for the light shielding film, was 25%. Moreover, a reflectance (back surface reflectance) on the lower layer side with respect to the wavelength of the ArF excimer laser light, which was measured for the light shielding film, was 22%.

Moreover, when a light transmittance of the light shielding film with respect to light having a wavelength of 880 nm, which was used in positioning of the exposure apparatus, was measured before the hard mask film was formed on the light shielding film by sputtering, the light transmittance was 50% or less.

[Pattern Formation]

The light shielding pattern and the digging pattern were formed in a procedure similar to that in Example 1 using the produced mask blank.

[Evaluation of Light Shielding Pattern (Before Etching Transparent Substrate)]

Figure 7:
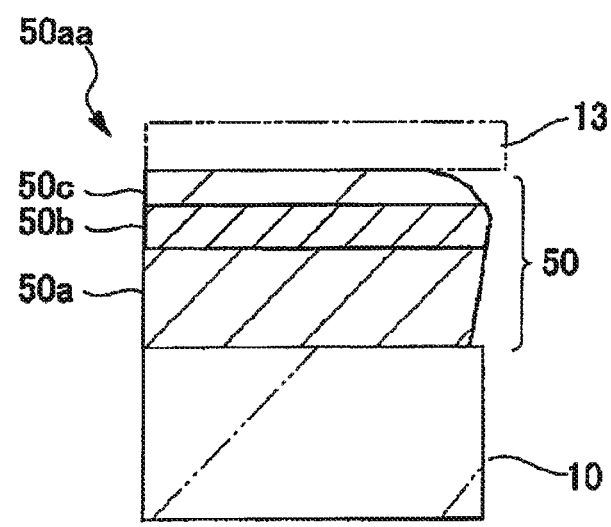
FIG. 7 is a cross-sectional view for illustrating a pattern formed in Comparative Example.

A cross-sectional shape of the light shielding pattern was checked as in Example 1. As a result, as illustrated in FIG. 7, the cross-sectional shape of the light shielding pattern 50aa was significantly eroded especially in the etched side walls on the hard mask film 13 side of the upper layer 50c, and was also eroded on the transparent substrate 10 side of the lower layer 50a.

[Evaluation of Digging Pattern 10aa]

When a shape of the digging pattern, which had been formed by etching the transparent substrate 10 using the resist film 31 and the light shielding pattern 50aa as masks, was evaluated, an amount of erosion with respect to the dimensions of the patterned hard mask film 13 was large, and an aperture width was increased.

Moreover, AIMS 193 (manufactured by Carl Zeiss AG) was used on the phase shift mask in this Comparative Example to perform a simulation of a transfer image when transferred by exposure to exposure light having a wavelength of 193 nm on the resist film on the semiconductor device. When the image transferred by the exposure in the simulation was examined, a transfer defect was observed. Factors that caused the transfer defect were expected to be that verticality of the shape of the patterned side walls of the light shielding pattern 50aa was poor, and that line edge roughness was also poor. This result shows that when the phase shift mask in this Comparative Example is set on a mask stage of an exposure apparatus, and when the resist film on the semiconductor device is subjected to the transferring by the exposure, defective points are disadvantageously generated in a circuit pattern to be finally formed on the semiconductor device.

This invention has been described by way of preferred embodiments so far. However, it goes without saying that this invention is not limited to those embodiments and various modifications can be made thereto without departing from the gist of this invention, and those modifications are encompassed in the scope of this invention as well.

This application is based on and claims the benefit of priority from Japanese Patent Application No. 2011-69812, filed on Mar. 28, 2014, the entire disclosure of which is incorporated herein by reference.

REFERENCE SIGNS LIST 1, 2 . . . mask blank, 3, 3' . . . phase shift mask, 10 . . . transparent substrate, 10aa . . . digging pattern, 11, 11' . . . light shielding film, 11a, 11a' . . . lower layer, 11b . . . intermediate layer, 11c . . . upper layer, 11aa, 11aa' . . . light shielding pattern, 13 . . . hard mask film, 15 . . . resist film, S . . . main surface

The invention claimed is:

1. A mask blank having a structure in which, on a transparent substrate, a light shielding film and a hard mask film are laminated in the stated order from the transparent substrate side,
the hard mask film being formed of a material containing at least one element selected from silicon and tantalum,
the light shielding film being formed of a material containing chromium, and having a structure of three layers wherein a lower layer, an intermediate layer, and an upper layer are laminated in the stated order from the transparent substrate side,
the upper layer having a lowest content of chromium in the light shielding film,
the intermediate layer having a highest content of chromium in the light shielding film, and containing metallic element indium.

2. The mask blank according to claim 1, wherein each of the upper layer and the lower layer has a total content of the metallic element that is lower than a total content of the metallic element of the intermediate layer, or does not contain the metallic element.

3. The mask blank according to claim 1, wherein the upper layer has a highest content of oxygen in the light shielding film.

4. The mask blank according to claim 1,
wherein the lower layer has a total content of the metallic element that is lower than a total content of the metallic element of the intermediate layer, and
wherein the upper layer has a lowest total content of the metallic element in the light shielding film, or does not contain the metallic element.

5. The mask blank according to claim 1, wherein the intermediate layer has a lowest content of oxygen in the light shielding film, or does not contain oxygen.

6. The mask blank according to claim 1, wherein the hard mask film is formed of a material containing silicon and oxygen.

7. The mask blank according to claim 1, wherein the light shielding film is capable of being patterned by dry etching using a mixture gas of a chlorine-based gas and an oxygen gas.

8. The mask blank according to claim 1, wherein the hard mask film is capable of being patterned by dry etching using a fluorine-based gas.

9. The method of manufacturing a phase shift mask using the mask blank of claim 1, the method comprising the steps of:
forming a light shielding pattern in the hard mask film by dry etching using a fluorine-based gas and using as a mask a resist film having a light shielding pattern, which is formed on the hard mask film;
forming the light shielding pattern in the light shielding film by dry etching using a mixture gas of a chlorine-based gas and an oxygen gas, and using as a mask the hard mask film, in which the light shielding pattern has been formed; and
forming a digging pattern in the transparent substrate by dry etching using a fluorine-based gas and using as a mask a resist film having the digging pattern, which is formed on the light shielding film.

10. A phase shift mask having a structure in which a light shielding film, in which a light shielding pattern is formed, is laminated on one main surface of a transparent substrate having a digging pattern formed on a one main surface side, the light shielding film being formed of a material containing chromium, and having a structure of three layers wherein a lower layer, an intermediate layer, and an upper layer are laminated in the stated order from the transparent substrate side, the upper layer having a lowest content of chromium in the light shielding film, the intermediate layer having a highest content of chromium in the light shielding film, and containing metallic element indium.

11. The phase shift mask according to claim 10, wherein each of the upper layer and the lower layer has a total content of the metallic element that is lower than a total content of the metallic element of the intermediate layer, or does not contain the metallic element.

12. The phase shift mask according to claim 10, wherein the upper layer has a highest content of oxygen in the light shielding film.

13. The phase shift mask according to claim 10,
wherein the lower layer has a total content of the metallic element that is lower than a total content of the metallic element of the intermediate layer, and
wherein the upper layer has a lowest total content of the metallic element in the light shielding film, or does not contain the metallic element.

14. The phase shift mask according to claim 10, wherein the intermediate layer has a lowest content of oxygen in the light shielding film, or does not contain oxygen.

15. The phase shift mask according to claim 10, wherein the light shielding film is capable of being patterned by dry etching using a mixture gas of a chlorine-based gas and an oxygen gas.

16. A method of manufacturing a semiconductor device, comprising an exposure step of patterning and transferring a transfer pattern of a phase shift mask, which is produced by the method of manufacturing a phase shift mask of claim 9, on a resist film on a substrate by a lithography method using the phase shift mask.

17. A method of manufacturing a semiconductor device, comprising an exposure step of patterning and transferring a transfer pattern of the phase shift mask of claim 10 on a resist film on a substrate by a lithography method using the phase shift mask.

18. The mask blank according to claim 1, wherein the intermediate layer has a ratio of a content of indium to a total content of chromium and indium of 5% or more and 50% or less.

19. A mask blank having a structure in which, on a transparent substrate, a light shielding film and a hard mask film are laminated in the stated order from the transparent substrate side, the hard mask film being formed of a material containing at least one element selected from silicon and tantalum, the light shielding film being formed of a material containing chromium, and having a structure of three layers wherein a lower layer, an intermediate layer, and an upper layer are laminated in the stated order from the transparent substrate side, the upper layer having a lowest content of chromium in the light shielding film, the intermediate layer having a highest content of chromium in the light shielding film, and containing at least one metallic element selected from indium, tin, and molybdenum, wherein a content of the at least one metallic element in the intermediate layer is greater than those of the lower and the upper layers.

20. The mask blank according to claim 19, wherein the at least one metallic element is indium and is included only in the intermediate layer.

* * * * *